United States Patent [19]

Flamm

[11] Patent Number: 6,017,221

[45] Date of Patent: Jan. 25, 2000

[54] PROCESS DEPENDING ON PLASMA DISCHARGES SUSTAINED BY INDUCTIVE COUPLING

[76] Inventor: Daniel L. Flamm, 476 Green View Dr., Walnut Creek, Calif. 94596

[21] Appl. No.: 08/866,040

[22] Filed: May 30, 1997

Related U.S. Application Data

[63] Continuation-in-part of application No. 08/736,315, Oct. 23, 1996, abandoned, which is a continuation of application No. 08/567,224, Dec. 4, 1995, abandoned.

[51] Int. Cl.$^7$ .................................................. H01L 21/00
[52] U.S. Cl. ........................... 437/225; 437/228; 437/233; 156/643; 156/192.25; 204/192.32
[58] Field of Search ............................. 118/50.1; 156/643, 156/345, 646, 659.1; 219/121.41, 121.44; 204/192.1, 192.12, 192.25; 427/12; 216/2; 437/225, 228, 233

[56] References Cited

U.S. PATENT DOCUMENTS

| | | |
|---|---|---|
| 3,873,884 | 3/1975 | Gabriel . |
| 4,368,092 | 1/1983 | Steinberg et al. . |
| 4,918,031 | 4/1990 | Flamm et al. . |
| 4,943,345 | 7/1990 | Asmussen et al. ............... 156/643 |
| 5,234,529 | 8/1993 | Johnson . |
| 5,241,245 | 8/1993 | Barnes et al. . |
| 5,304,282 | 4/1994 | Flamm . |
| 5,361,016 | 11/1994 | Ohkawa et al. ............... 315/111.41 |
| 5,431,968 | 7/1995 | Miller et al. . |
| 5,534,231 | 7/1996 | Savas . |
| 5,637,961 | 6/1997 | Ishii et al. . |

OTHER PUBLICATIONS

Asmussen et al., "The Design of a Microwave Plasma Cavity," *Proc. of IEEE,* 62(1):109–117 (Jan. 1974).
Eckert, "The Hundred Year History of Induction Discharges," 2$^{nd}$ *Ann. Int'l Conf. Plasma Chem. Tech.,* (1984).
Fossheim et al., "Broadband tguning of helical resonant cavitites," *J. Phys. E. Sci. Instrum.,* 11:892–893 (1978).
Niazi et al. "Operation of a helical resonator plasma source," *Plasma Sources Sci. Technol.,* 3:482–495 (1994).
Roppel et al., "Low temperature oxidation of silicon using a microwave plasma disk source," *J. Vac. sci. Technol.,* B4(1):295–298 (Jan./Feb. 1986).
Zverev et al., "Realization of a Filter with Helical Components," *IRE Trans. on Component Parts,* pp. 99–110, (Sep. 1961).

*Primary Examiner*—Laurie Scheiner
*Attorney, Agent, or Firm*—Townsend and Townsend and Crew LLP

[57] ABSTRACT

A process for fabricating a product 28, 119. The process comprises the steps of subjecting a substrate to a composition of entities, at least one of the entities emanating from a species generated by a gaseous discharge excited by a high frequency field in which the vector sum of phase and anti-phase capacitive coupled voltages from the inductive coupling structure substantially balances.

7 Claims, 13 Drawing Sheets

PROCESS DEPENDING ON PLASMA DISCHARGES SUSTAINED BY INDUCTIVE COUPLING

CROSS REFERENCES TO RELATED APPLICATIONS

This application is a continuation-in-part of application Ser. No. 08/736,315 filed Oct. 23, 1996, now abandoned, which is a continuation of application Ser. No. 08/567,224 filed Dec. 4, 1995, now abandoned. All of these documents are hereby incorporated by reference for all purposes.

BACKGROUND OF THE INVENTION

This invention relates generally to plasma processing. More particularly, the invention is for plasma processing of devices using an inductive discharge. This invention is illustrated in an example with regard to plasma etching and resist stripping of semiconductor devices. The invention also is illustrated with regard to chemical vapor deposition (CVD) of semiconductor devices. But it will be recognized that the invention has a wider range of applicability. Merely by way of example, the invention also can be applied in other plasma etching applications, and deposition of materials such as silicon, silicon dioxide, silicon nitride, polysilicon, among others.

Plasma processing techniques can occur in a variety of semiconductor manufacturing processes. Examples of plasma processing techniques occur in chemical dry etching (CDE), ion-assisted etching (IAE), and plasma enhanced chemical vapor deposition (PECVD), including remote plasma deposition (RPCVD) and ion-assisted plasma enhanced chemical vapor deposition (IAPECVD). These plasma processing techniques often rely upon radio frequency power (rf) supplied to an inductive coil for providing power to gas phase species in forming a plasma.

Plasmas can be used to form neutral species (i.e., uncharged) for purposes of removing or forming films in the manufacture of integrated circuit devices. For instance, chemical dry etching generally depends on gas-surface reactions involving these neutral species without substantial ion bombardment.

In other manufacturing processes, ion bombardment to substrate surfaces is often undesirable. This ion bombardment, however, is known to have harmful effects on properties of material layers in devices and excessive ion bombardment flux and energy can lead to intermixing of materials in adjacent device layers, breaking down oxide and "wear out," injecting of contaminative material formed in the processing environment into substrate material layers, harmful changes in substrate morphology (e.g. amophotization), etc.

Ion assisted etching processes, however, rely upon ion bombardment to the substrate surface in defining selected films. But these ion assisted etching processes commonly have a lower selectivity relative to conventional CDE processes. Hence, CDE is often chosen when high selectivity is desired and ion bombardment to substrates are to be avoided.

One commonly used chemical dry etching technique is conventional photoresist stripping, often termed ashing or stripping. Conventional resist stripping relies upon a reaction between a neutral gas phase species and a surface material layer, typically for removal. This reaction generally forms volatile products with the surface material layer for its removal. The neutral gas phase species is formed by a plasma discharge. This plasma discharge can be sustained by a coil (e.g., helical coil, etc.) operating at a selected frequency in a conventional photoresist stripper. An example of the conventional photoresist stripper is a quarter-wave helical resonator stripper, which is described by U.S. Pat. No. 4,368,092 in the name of Steinberg et al.

Referring to the above, an objective in chemical dry etching is to reduce or even eliminate ion bombardment (or ion flux) to surfaces being processed to maintain the desired etching selectivity. In practice, however, it is often difficult to achieve using conventional techniques. These conventional techniques generally attempt to control ion flux by suppressing the amount of charged species in the plasma source reaching the process chamber. A variety of techniques for suppressing these charged species have been proposed.

These techniques often rely upon shields, baffles, large separation distances between the plasma source and the chamber, or the like, placed between the plasma source and the process chamber. The conventional techniques generally attempt to directly suppress charge density downstream of the plasma source by interfering with convective and diffusive transport of charged species. They tend to promote recombination of charged species by either increasing the surface area (e.g., baffles, etc.) relative to volume, or increasing flow time, which relates to increasing the distance between the plasma source and the process chamber.

These baffles, however, cause loss of desirable neutral etchant species as well. The baffles, shields, and alike, also are often cumbersome. Baffles, shields, or the large separation distances also cause undesirable recombinative loss of active species and sometimes cause radio frequency power loss and other problems. These baffles and shields also are a potential source of particulate contamination, which is often damaging to integrated circuits.

Baffles, shields, spatial separation, and alike, when used alone also are often insufficient to substantially prevent unwanted parasitic plasma currents. These plasma currents are generated between the wafer and the plasma source, or between the plasma source and walls of the chamber. It is commonly known that when initial charged species levels are present in an electrical field, the charged species are accelerated and dissociative collisions with neutral particles can multiply the concentration of charge to higher levels. If sufficient "seed" levels of charge and rf potentials are present, the parasitic plasma in the vicinity of the process wafer can reach harmful charge density levels. In some cases, these charge densities may be similar to or even greater than plasma density within the source plasma region, thereby causing even more ion flux to the substrate.

Charge densities also create a voltage difference between the plasma source and processing chamber or substrate support, which can have an additional deleterious effect. This voltage difference enhances electric fields that can accelerate extraction of charge from the plasma source. Hence, their presence often induces increased levels of charge to be irregularly transported from the plasma source to process substrates, thereby causing non-uniform ion assisted etching.

Conventional ion assisted plasma etching, however, often requires control and maintenance of ion flux intensity and uniformity within selected process limits and within selected process energy ranges. Control and maintenance of ion flux intensity and uniformity are often difficult to achieve using conventional techniques. For instance, capacitive coupling between high voltage selections of the coil and the plasma discharge often cause high and uncontrollable plasma potentials relative to ground. It is generally understood that voltage difference between the plasma and ground can cause damaging high energy ion bombardment of articles being processed by the plasma, as illustrated by U.S. Pat. No. 5,234,529 in the name of Johnson. It is further often understood that rf component of the plasma potential varies in time since it is derived from a coupling to time varying rf excitation. Hence, the energy of charged particles from plasma in conventional inductive sources is spread over a relatively wide range of energies, which undesirably tends to introduce uncontrolled variations in the processing of articles by the plasma.

The voltage difference between the region just outside of a plasma source and the processing chamber can be modified by introducing internal conductive shields or electrode elements into the processing apparatus downstream of the source. When the plasma potential is elevated with respect to these shield electrodes, however, there is a tendency to generate an undesirable capacitive discharge between the shield and plasma source. These electrode elements are often a source of contamination and the likelihood for contamination is even greater when there is capacitive discharge (ion bombardment from capacitive discharge is a potential source of sputtered material). Contamination is damaging to the manufacture of integrated circuit devices.

Another limitation is that the shield or electrode elements generally require small holes therein as structural elements. These small holes are designed to allow gas to flow therethrough. The small holes, however, tend to introduce unwanted pressure drops and neutral species recombination. If the holes are made larger, the plasma from the source tends to survive transport through the holes and unwanted downstream charge flux will often result. In addition, undesirable discharges to these holes in shields can, at times, produce an even more undesirable hollow cathode effect.

In conventional helical resonator designs, conductive external shields are interposed between the inductive power (e.g., coil, etc.) and walls of the vacuum vessel containing the plasma. A variety limitations with these external capacitive shielded plasma designs (e.g., helical resonator, inductive discharge, etc.) have been observed. In particular, the capacitively shielded design often produces plasmas that are difficult to tune and even ignite. Alternatively, the use of unshielded plasma sources (e.g., conventional quarter-wave resonator, conventional half-wave resonator, etc.) attain a substantial plasma potential from capacitive coupling to the coil, and hence are prone to create uncontrolled parasitic plasma currents to grounded surfaces. Accordingly, the use of either the shielded or the unshielded sources using conventional quarter and half-wave rf frequencies produce undesirable results.

In many conventional plasma sources a means of cooling is required to maintain the plasma source and substrates being treated below a maximum temperature limit. Power dissipation in the structure causes heating and thereby increases the difficulty and expense of implementing effective cooling means. Inductive currents may also be coupled from the excitation coil into internal or capacitive shields and these currents are an additional source of undesirable power loss and heating. Conventional capacitive shielding in helical resonator discharges utilized a shield which was substantially split along the long axis of the resonator to lessen eddy current loss. However, such a shield substantially perturbs the resonator characteristics owing to unwanted capacitive coupling and current which flows from the coil to the shield. Since there are no general design equations, nor are properties currently known for resonators which are "loaded" with a shield along the axis, sources using this design must be sized and made to work by trial and error.

In inductive discharges, it is highly desirable to be able to substantially control the plasma potential relative to ground potential, independent of input power, pressure, gas composition and other variables. In many cases, it is desired to have the plasma potential be substantially at ground potential (at least offset from ground potential by an amount insignificantly different from the floating potential or intrinsic DC plasma potential). For example, when a plasma source is utilized to generate neutral species to be transported downstream of the source for use in ashing resist on a semiconductor device substrate (a wafer or flat panel electronic display), the concentration and potential of charged plasma species in the reaction zone are desirably reduced to avoid charging damage from electron or ionic current from the plasma to the device. When there is a substantial potential difference between plasma in the source and grounded surfaces beyond the source, there is a tendency for unwanted parasitic plasma discharges to form outside of the source region.

Another undesirable effect of potential difference is the acceleration of ions toward grounded surfaces and subsequent impact of the energetic ions with surfaces. High energy ion bombardment may cause lattice damage to the device substrate being processed and may cause the chamber wall or other chamber materials to sputter and contaminate device wafers. In other plasma processing procedures, however, some ion bombardment may be necessary or desirable, as is the case particularly for anisotropic ion-induced plasma etching procedures (for a discussion of ion-enhanced plasma etching mechanisms See Flamm (Ch. 2, pp.94–183 in Plasma Etching, An Introduction, D. M. Manos and D. L. Flamm, eds., Academic Press, 1989)). Consequently, uncontrolled potential differences, such as that caused by "stray" capacitive coupling from the coil of an inductive plasma source to the plasma, are undesirable.

Referring to the above limitations, conventional plasma sources also have disadvantages when used in conventional plasma enhanced CVD techniques. These techniques commonly form a reaction of a gas composition in a plasma discharge. One conventional plasma enhanced technique relies upon ions aiding in rearranging and stabilizing the film, provided the bombardment from the plasma is not sufficiently energetic to damage the underlying substrate or the growing film. Conventional resonators and other types of inductive discharges often produce parasitic plasma currents from capacitive coupling, which often detrimentally influences film quality, e.g., an inferior film, etc. These parasitic plasma currents are often uncontrollable, and highly undesirable. These plasma sources also have disadvantages in other plasma processing techniques such as ion-assisted etching, and others. Of course, the particular disadvantage will often depend upon the application.

To clarify certain concepts used in this application, it will be convenient to introduce these definitions.

Ground (or ground potential): These terms are defined as a reference potential which is generally taken as the potential of a highly conductive shield or other highly conductive surface which surrounds the plasma source. To be a true ground shield in the sense of this definition, the RF conductance at the operating frequency is often substantially high so that potential differences generated by current within the shield are of negligible magnitude compared to potentials intentionally applied to the various structures and elements of the plasma source or substrate support assembly. However, some realizations of plasma sources do not incorporate a shield or surface with adequate electrical susceptance to meet this definition. In implementations where there is a surrounding conductive surface that is somewhat similar to a ground shield or ground plane, the ground potential is taken to be the fictitious potential which the imperfect grounded surface would have equilibrated to if it had zero high frequency impedance. In designs where there is no physical surface which is adequately configured or which does not have insufficient susceptance to act as a "ground" according to the above definition, ground potential is the potential of a fictitious surface which is equi-potential with the shield or "ground" conductor of an unbalanced transmission line connection to the plasma source at its RF feed point. In designs where the plasma source is connected to an RF generator with a balanced transmission line RF feed, "ground" potential is the average of the driven feed line potentials at the point where the feed lines are coupled to the plasma source.

Inductively Coupled Power: This term is defined as power transferred to the plasma substantially by means of a time-varying magnetic flux which is induced within the volume containing the plasma source. A time-varying magnetic flux induces an electromotive force in accord with Maxwell's equations. This electromotive force induces motion by electrons and other charged particles in the plasma and thereby imparts energy to these particles.

RF inductive power source and bias power supply: In most conventional inductive plasma source reactors, power is supplied to an inductive coupling element (the inductive coupling element is often a multi-turn coil which abuts a dielectric wall containing a gas where the plasma is ignited at low pressure) by an rf power generator.

Conventional Helical Resonator: Conventional helical resonator can be defined as plasma applicators. These plasma applicators have been designed and operated in multiple configurations, which were described in, for example, U.S. Pat. No. 4,918,031 in the names of Flamm et al., U.S. Pat. No. 4,368,092 in the name of Steinberg et al., U.S. Pat. No. 5,304,282 in the name of Flamm, U.S. Pat. No. 5,234,529 in the name of Johnson, U.S. Pat. No. 5,431,968 in the name of Miller, and others. In these configurations, one end of the helical resonator applicator coil has been grounded to its outer shield. In one conventional configuration, a quarter wavelength helical resonator section is employed with one end of the applicator coil grounded and the other end floating (i.e., open circuited). A trimming capacitance is sometimes connected between the grounded outer shield and the coil to "fine tune" the quarter wave structure to a desired resonant frequency that is below the native resonant frequency without added capacitance. In another conventional configuration, a half-wavelength helical resonator section was employed in which both ends of the coil were grounded. The function of grounding the one or both ends of the coil was believed to be not essential, but advantageous to "stabilize the plasma operating characteristics" and "reduce the possibility of coupling stray current to nearby objects." See U.S. Pat. No. 4,918,031.

Conventional resonators have also been constructed in other geometrical configurations. For instance, the design of helical resonators with a shield of square cross section is described in Zverev et al., IRE Transactions on Component Parts, pp. 99–110, Sept. 1961. Johnson (U.S. Pat. No. 5,234,529) teaches that one end of the cylindrical spiral coil in a conventional helical resonator may be deformed into a planar spiral above the top surface of the plasma reactor tube. U.S. Pat. No. 5,241,245 in the names of Barnes et al. teach the use of conventional helical resonators in which the spiral cylindrical coil is entirely deformed into a planar spiral arrangement with no helical coil component along the sidewalls of the plasma source (this geometry has often been referred to as a "transformer coupled plasma," termed a TCP).

From the above it is seen that an improved technique, including a method and apparatus, for plasma processing is often desired.

SUMMARY OF THE INVENTION

The present invention provides a technique, including a method and apparatus, for fabricating a product using a plasma discharge. The present technique relies upon the control of the instantaneous plasma AC potential to selectively control a variety of plasma characteristics. These characteristics include the amount of neutral species, the amount of charged species, overall plasma potential, the spatial extent and distribution of plasma density, the distribution of electrical current, and others. This technique can be used in applications including chemical dry etching (e.g., stripping, etc.), ion-enhanced etching, plasma immersion ion implantation, chemical vapor deposition and material growth, and others.

In one aspect of the invention, a process for fabricating a product is provided. These products include a varieties of devices (e.g., semiconductor, flat panel displays, micromachined structures, etc.) and materials, e.g., diamonds, raw materials, plastics, etc. The process includes steps of subjecting a substrate to a composition of entities. At least one of the entities emanates from a species generated by a gaseous discharge excited by a high frequency field in which the vector sum of phase and anti-phase capacitive coupled voltages (e.g., AC plasma voltage) from the inductive coupling structure substantially balances. This process provides for a technique that is substantially free from stray or parasitic capacitive coupling from the plasma source to chamber bodies (e.g., substrate, walls, etc.) at or near ground potential.

In another aspect of the invention, another process for fabricating a product is provided. The process includes steps of subjecting a substrate to a composition of entities. At least one of the entities emanates from a species generated by a gaseous discharge excited by a high frequency field in which the vector sum of phase and anti-phase capacitive coupled voltages from the inductive coupling structure is selectively maintained. This process provides for a technique that can selectively control the amount of capacitive coupling to chamber bodies at or near ground potential.

A further aspect of the invention provides yet another process for fabricating a product. This process includes steps of subjecting a substrate to a composition of entities. At least one of the entities emanates from a species generated by a gaseous discharge excited by a high frequency field in which the vector sum of phase and anti-phase capacitive coupled voltages from the inductive coupling structure is selectively maintained. A further step of selectively applying a voltage between the at least one of the entities in the plasma source and a substrate is provided. This process provides for a technique that can selectively control the amount of capacitive coupling to chamber bodies at or near ground potential, and provide for a driving voltage between the entities and a substrate.

Another aspect of the invention provides another process for fabricating a product. The process comprises steps of subjecting a substrate to a composition of entities and using the resulting substrate for completion of the product. At least one of the entities emanates from a species generated by a gaseous discharge provided by a plasma applicator, e.g., a helical resonator, inductive coil, transmission line, etc. This plasma applicator has an integral current driven by capacitive coupling of a plasma column to elements with a selected potential greater than a surrounding shield potential substantially equal to capacitive coupling of the plasma column to substantially equal elements with a potential below shield potential.

In a further aspect, the invention provides an apparatus for fabricating a product. The apparatus has an enclosure comprising an outer surface and an inner surface. The enclosure houses a gaseous discharge. The apparatus also includes a plasma applicator (e.g., helical coil, inductive coil, transmission line, etc.) disposed adjacent to the outer surface. A high frequency power source operably coupled to the plasma applicator is included. The high frequency power source provides high frequency to excite the gaseous discharge to provide at least one entity from a high frequency field in which the vector sum of phase and anti-phase capacitive current coupled from the inductive coupling structure is selectively maintained.

In another aspect, the present invention provides an improved plasma discharge apparatus. This plasma discharge apparatus includes a plasma source, a plasma applicator (e.g., inductive coil, transmission line, etc.), and other elements. This plasma applicator provides a de-coupled plasma source. A wave adjustment circuit (e.g., RLC circuit, coil, transmission line, etc.) is operably coupled to the plasma applicator. The wave adjustment circuit can selectively adjust phase and anti-phase potentials of the plasma from an rf power supply. This rf power supply is operably coupled to the wave adjustment circuit.

The present invention achieves these benefits in the context of known process technology. However, a further understanding of the nature and advantages of the present invention may be realized by reference to the latter portions of the specification and attached drawings.

DETAILED DESCRIPTION OF THE INVENTION

Figure 1:
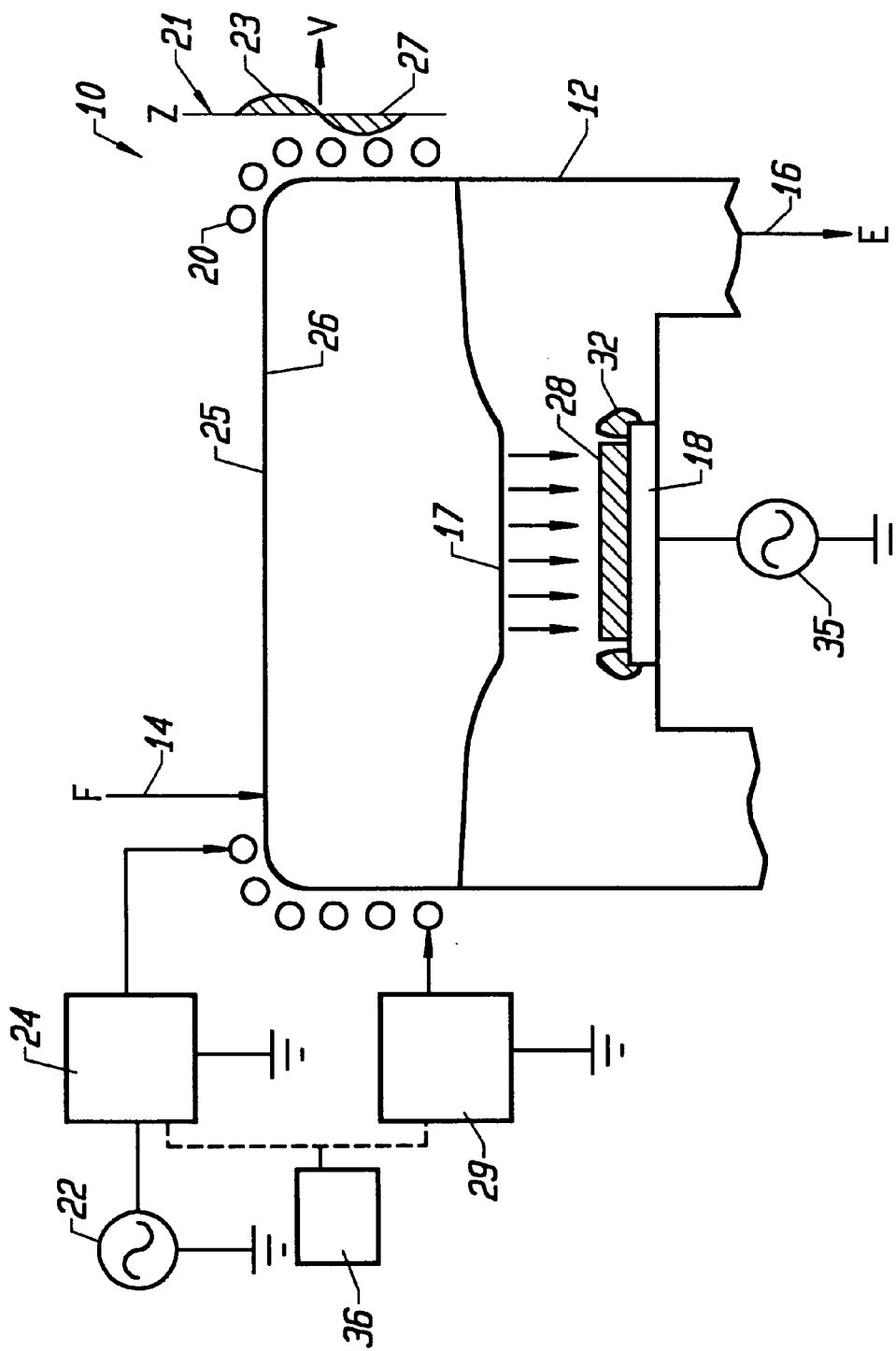
FIG. 1 is a simplified diagram of a plasma etching apparatus according to the present invention.

FIG. 1 is a simplified diagram of a plasma etch apparatus 10 according to the present invention. This etch apparatus is provided with an inductive applicator, e.g., inductive coil. This etch apparatus depicted, however, is merely an illustration, and should not limit the scope of the claims as defined herein. One of ordinary skilled in the art may implement the present invention with other treatment chambers and the like.

The etch apparatus includes a chamber 12, a feed source 14, an exhaust 16, a pedestal 18, an inductive applicator 20, a radio frequency (rf) power source 22 to the inductive applicator 20, wave adjustment circuits 24, 29 (WACs), a radio frequency power source 35 to the pedestal 18, a controller 36, and other elements. Optionally, the etch apparatus includes a gas distributor 17.

The chamber 12 can be any suitable chamber capable of housing a product 28, such as a wafer to be etched, and for providing a plasma discharge therein. The chamber can be a domed chamber for providing a uniform plasma distribution over the product 28 to be etched, but the chamber also can be configured in other shapes or geometries, e.g., flat ceiling, truncated pyramid, cylindrical, rectangular, etc. Depending upon the application, the chamber is selected to produce a uniform entity density over the pedestal 18, providing a high density of entities (i.e., etchant species) for etching uniformity.

The present chamber includes a dome 25 having an interior surface 26 made of quartz or other suitable materials. The exterior surface of the chamber is typically a dielectric material such as a ceramic or the like. Chamber 12 also includes a process kit with a focus ring 32, a cover (not shown), and other elements. Preferably, the plasma discharge is derived from the inductively coupled plasma source that is a de-coupled plasma source (DPS) or a helical resonator, although other sources can be employed.

The de-coupled source originates from rf power derived from the inductive applicator 20. Inductively coupled power is derived from the power source 22. The rf signal frequencies ranging from 800 kHz to 80 MHz can be provided to the inductive applicator 20. Preferably, the rf signal frequencies range from 5 MHz to 60 MHz. The inductive applicator (e.g., coil, antenna, transmission line, etc.) overlying the chamber ceiling can be made using a variety of shapes and ranges of shapes. For example, the inductive applicator can be a single integral conductive film, a transmission line, or multiple coil windings. The shape of the inductive applicator and its location relative to the chamber are selected to provide a plasma overlying the pedestal to improve etch uniformity.

The plasma discharge (or plasma source) is derived from the inductive applicator 20 operating at selected phase 23 and anti-phase 27 potentials (i.e., voltages) that substantially cancel each other. The controller 36 is operably coupled to the wave adjustment circuits 24, 29. In one embodiment, wave adjustment circuits 24, 29 provide an inductive applicator operating at full-wave multiples 21. This embodiment of full-wave multiple operation provides for balanced capacitance of phase 23 and anti-phase voltages 27 along the inductive applicator (or coil adjacent to the plasma). This full-wave multiple operation reduces or substantially eliminates the amount of capacitively coupled power from the plasma source to chamber bodies (e.g., pedestal, walls, wafer, etc.) at or close to ground potential. Alternatively, the wave adjustment circuits 24, 29 provide an inductive applicator that is effectively made shorter or longer than a full-wave length multiple by a selected amount, thereby operating at selected phase and anti-phase voltages that are not full-wave multiples. Alternatively, more than two, one or even no wave adjustment circuits can be provided in other embodiments. But in all of these above embodiments, the phase and anti-phase potentials substantially cancel each other, thereby providing substantially no capacitively coupled power from the plasma source to the chamber bodies.

In alternative embodiments, the wave adjustment circuit can be configured to provide selected phase and anti-phase coupled voltages coupled from the inductive applicator to the plasma that do not cancel. This provides a controlled potential between the plasma and the chamber bodies, e.g., the substrate, grounded surfaces, walls, etc. In one embodiment, the wave adjustment circuits can be used to selectively reduce current (i.e., capacitively coupled current) to the plasma. This can occur when certain high potential difference regions of the inductive applicator to the plasma are positioned (or kept) away from the plasma region (or inductor-containing-the-plasma region) by making them go into the wafer adjustment circuit assemblies, which are typically configured outside of the plasma region. In this embodiment, capacitive current is reduced and a selected degree of symmetry between the phase and anti-phase of the coupled voltages is maintained, thereby providing a selected potential or even substantially ground potential. In other embodiments, the wave adjustment circuits can be used to selectively increase current (i.e., capacitively coupled current) to the plasma.

As shown, the wave adjustment circuits are attached (e.g., connected, coupled, etc.) to ends of the inductive applicator. Alternatively, each of these wave adjustment circuits can be attached at an intermediate position away from the inductive application ends. Accordingly, upper and lower tap positions for respective wave adjustment circuits can be adjustable. But both the inductive applicator portions below and above each tap position are active. That is, they both can interact with the plasma discharge.

A sensing apparatus can be used to sense plasma voltage and use automatic tuning of the wave adjustment circuits and any rf matching circuit between the rf generator and the plasma treatment chamber. This sensing apparatus can maintain the average AC potential at zero or a selected value relative to ground or any other reference value. This wave adjustment circuit provides for a selected potential difference between the plasma source and chamber bodies. These chamber bodies may be at a ground potential or a potential supplied by another bias supply, e.g., See FIG. 1 reference numeral 35. Examples of wave adjustment circuits are described by way of the FIGS. below.

For instance, FIGS. 2A to 2E are simplified configurations using the wave adjustment circuits according to the present invention. These simplified configurations should not limit the scope of the claims herein. In an embodiment, these wave adjustment circuits employ substantially equal circuit elements (e.g., inductors, capacitors, transmission line sections, and others) such that the electrical length of the wave adjustment circuits in series with the inductive applicator coupling power to the plasma is substantially an integral multiple of one wavelength. In other embodiments, the circuit elements provide for inductive applicators at other wavelength multiples, e.g., one-sixteenth-wave, one-eighth-wave, quarter-wave, half-wave, three-quarter wave, etc. In these embodiments (e.g., full-wave multiple, half-wave, quarter-wave, etc.), the phase and anti-phase relationship between the plasma potentials substantially cancel each other. In further embodiments, the wave adjustment circuits employ circuit elements that provide plasma applicators with phase and anti-phase potential relationships that do not cancel each other out using a variety of wave length portions.

Figure 2A:
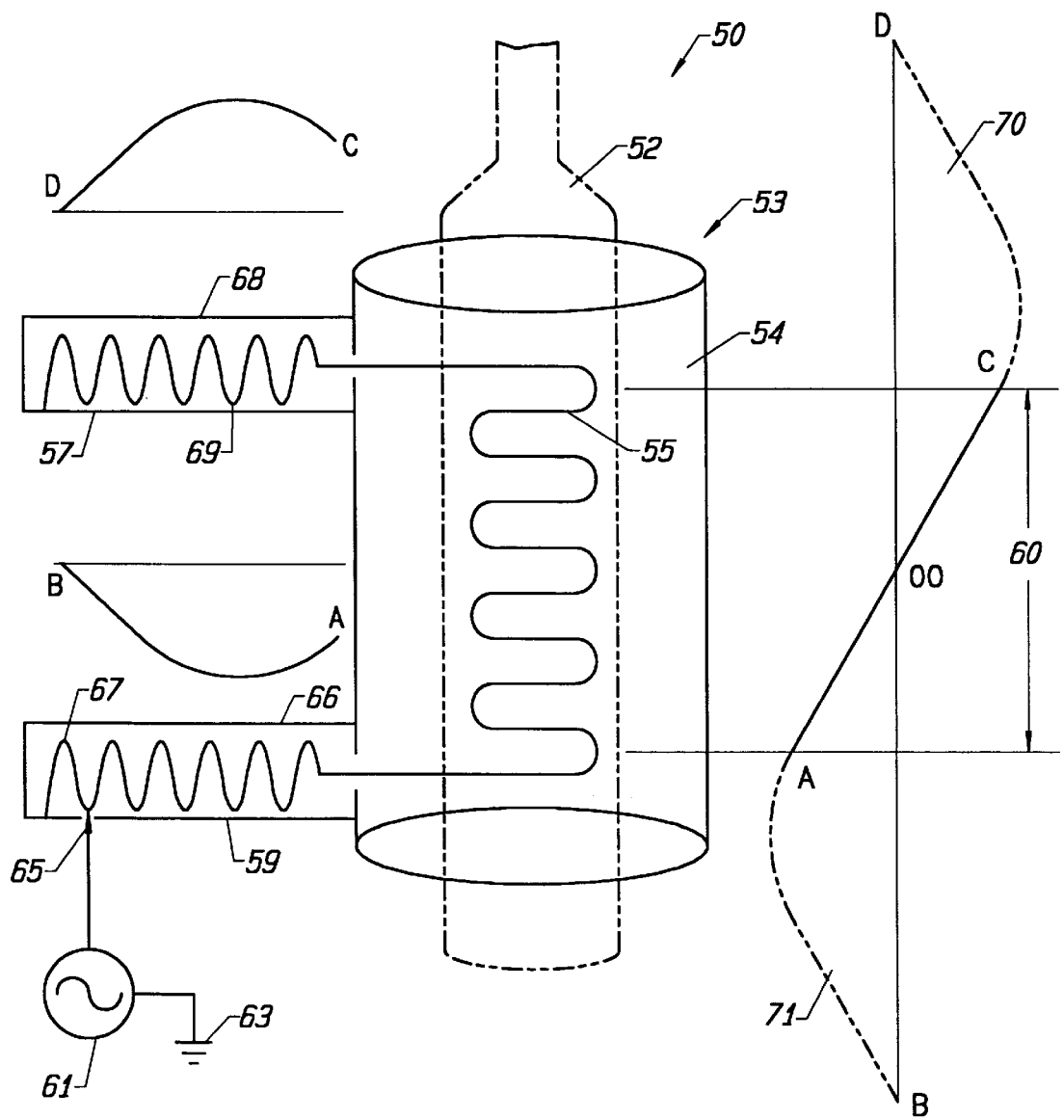
FIGS. 2A–2E are simplified configurations using wave adjustment circuits according to the present invention.

FIG. 2A is a simplified illustration of an embodiment 50 using wave adjustment circuits according to the present invention. This embodiment 50 includes a discharge tube 52, an inductive applicator 55, an exterior shield 54, an upper wave adjustment circuit 57, a lower wave adjustment circuit 59, an rf power supply 61, and other elements. The upper wave adjustment circuit 57 is a helical coil transmission line portion 69, outside of the plasma source region 60. Lower wave adjustment circuit 59 also is a helical coil transmission line portion 67 outside of the plasma source region 60. The power supply 61 is attached 65 to this lower helical coil portion 67, and is grounded 63. Each of the wave adjustment circuits also are shielded 66, 68.

In this embodiment, the wave adjustment circuits are adjusted to provide substantially zero AC voltage at one point on the inductive coil (refer to point 00 in FIG. 2A). This embodiment also provides substantially equal phase 70 and anti-phase 71 voltage distributions in directions about this point (refer to 00-A and 00-C in FIG. 2A) and provides substantially equal capacitance coupling to the plasma from physical inductor elements (00-C) and (00-A), carrying the phase and anti-phase potentials. Voltage distributions 00-A and 00-C are combined with C-D and A-B (shown by the phantom lines) would substantially comprise a full-wave voltage distribution in this embodiment where the desired configuration is a selected phase/antiphase portion of a full-wave inductor (or helical resonator) surrounding the plasma source discharge tube.

In this embodiment, it is desirable to reduce or minimize capacitive coupling current from the inductive element to the plasma discharge in the plasma source. Since the capacitive current increases monotonically with the magnitude of the difference of peak phase and anti-phase voltages, which occur at points A and C in FIG. 2A, this coupling can be lessened by reducing this voltage difference. In FIG. 2A, for example, it is achieved by way of two wave adjustment circuits 57, 59. Coil 55 (or discharge source) is a helical resonator and the wave adjustment circuits 57, 59 are helical resonators.

The discharge source helical resonator 53 can be constructed using conventional design formulae. Generally, this helical resonator includes an electrical length which is a selected phase portion "x" (A to 00 to C) of a full-wave helical resonator. The helical resonator wave adjustment circuits are each selected to comprise a portion (2-x) of full-wave helical resonators. Physical parameters for the wave adjustment helical resonators can be selected to realize practical physical dimensions and appropriate Q, $Z_o$, etc values. In particular, some or even all of the transmission line parameters (Q, $Z_o$, etc.) of the wave adjustment circuit sections may be selected to be substantially the same as the transmission line parameters of the inductive applicator. The portion of the inductive plasma applicator helical resonator, on the other hand, is designed and sized to provide selected uniformity values over substrate dimensions within an economical equipment size and reduced Q.

The wave adjustment circuit provides for external rf power coupling, which can be used to control and match power to the plasma source, as compared to conventional techniques used in helical resonators and the like. In particular, conventional techniques often match to, couple power to, or match to the impedance of the power supply to the helical resonator by varying a tap position along the coil above the grounded position, or selecting a fixed tap position relative to a grounded coil end and matching to the impedance at this position using a conventional matching network, e.g., LC network, network, etc. Varying this tap position along the coil within a plasma source is often cumbersome and generally imposes a difficult mechanical design problems. Using the fixed tap and external matching network also is cumbersome and can cause unanticipated changes in the discharge Q, and therefore influences its operating mode and stability. In the present embodiments, the wave adjustment circuits can be positioned outside of the plasma source (or constrained in space containing the inductive coil, e.g., See FIG. 2A. Accordingly, the mechanical design (e.g., means for varying tap position, change in the effective rf power coupling point by electrical means, etc.) of the tap position are simplified relative to those conventional techniques.

Figure 2B:
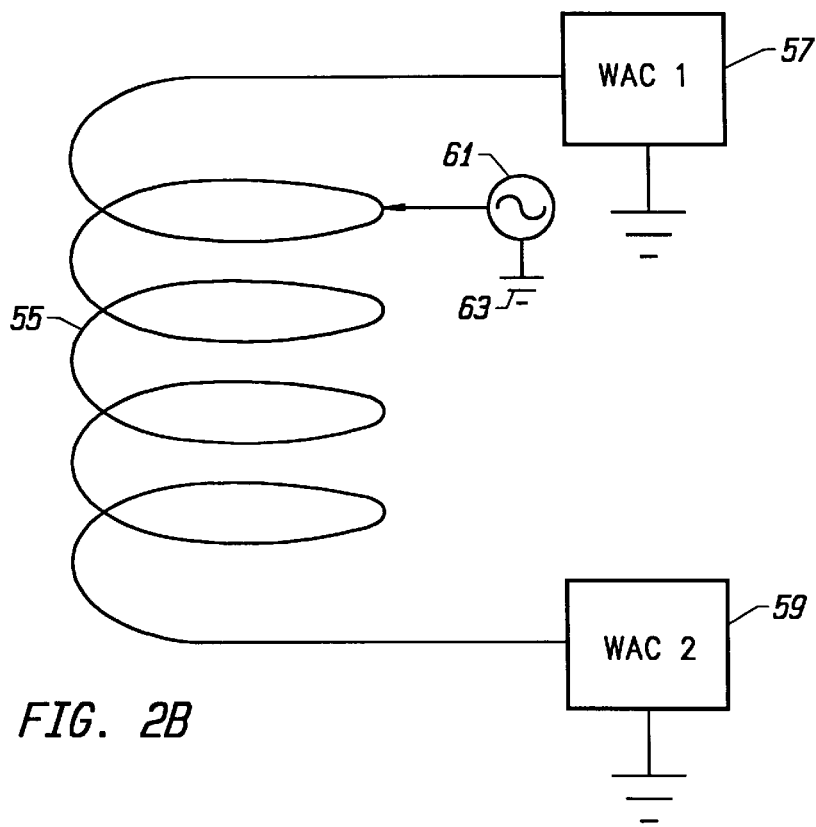
Figure 2C:
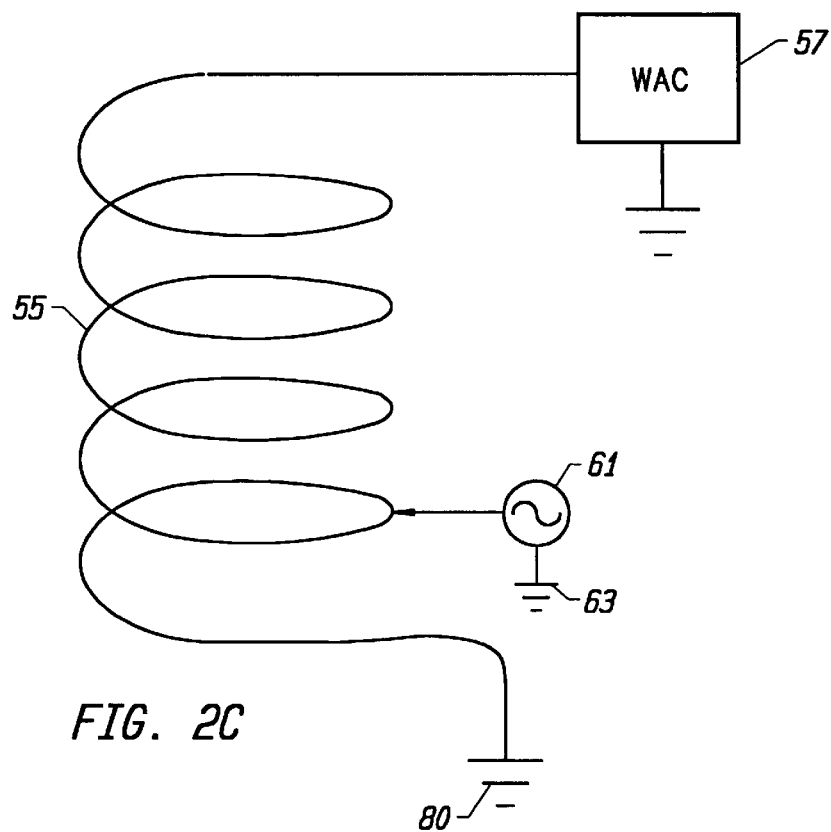

In the present embodiment, rf power is fed into the lower wave adjustment circuit 59. Alternatively, rf power can be fed into the upper wave adjustment circuit (not shown). The rf power also can be coupled directly into the inductive plasma coupling applicator (e.g., coil, etc.) in the wave adjustment circuit design, as illustrated by FIG. 2B. Alternatively, other application will use a single wave adjustment circuit, as illustrated by FIG. 2C. Power can be coupled into this wave adjustment circuit or by conventional techniques such as a tap in the coil phase. In some embodiments, this tap in the coil phase is positioned above the grounded end. An external impedance matching network may then be operably coupled to the power for satisfactory power transfer efficiency from, for example, a conventional coaxial cable to impedances (current to voltage rations) existing between the wave adjustment circuit terminated end of the applicator.

Figure 2D:
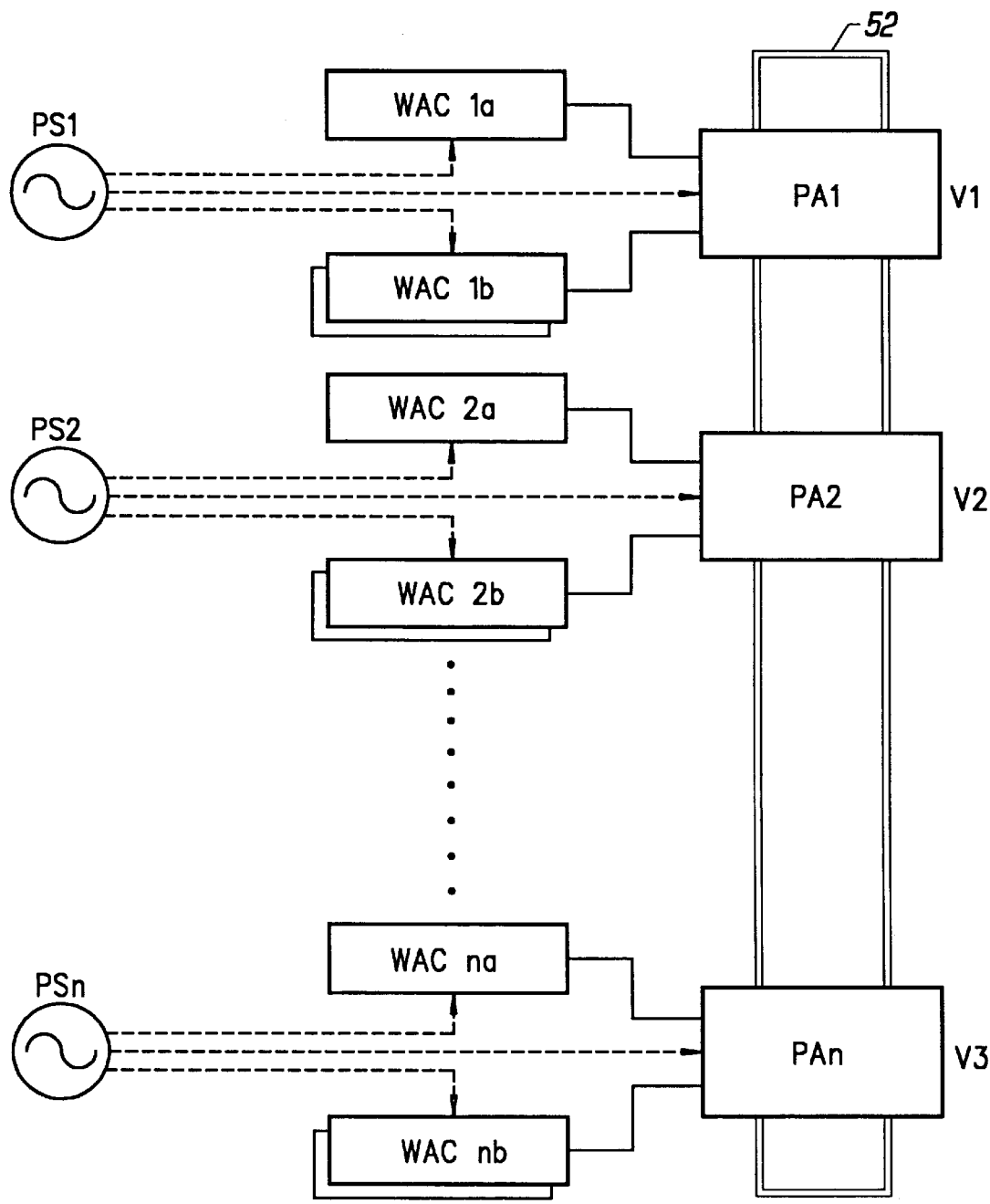

A further embodiment using multiple inductive plasma applicators also is provided, as shown in FIG. 2D. This embodiment includes multiple plasma applicators (PA1, PA2 . . . PAn). These plasma applicators respectively provide selected combinations of inductively coupled power and capacitively coupled power from respective voltage potentials (V1, V2 . . . Vn). Each of these plasma applicators derives power from its power source (PS1, PS2 . . . PSn) either directly through an appropriate matching or coupling network or by coupling to a wave adjustment circuit as described. Alternatively, a single power supply using power splitters and impedance matching networks can be coupled to each (or more than two) of the plasma applicators. Alternatively, more than one power supply can be used where at least one power supply is shared among more than one plasma applicator. Each power source is coupled to its respective wave adjustment circuits (WAC1, WAC2 . . . WACn).

Generally, each plasma applicator has an upper wave adjustment circuit (e.g., WAC 1a, WAC 2a . . . WACna) and a lower wave adjustment circuit (e.g., WAC1b, WAC2b . . . WACnb). The combination of upper and lower wave adjustment circuits are used to adjust the plasma source potential for each plasma source zone. Alternatively, a single wave adjustment circuit can be used for each plasma applicator. Each wave adjustment circuit can provide substantially the same impedance characteristics, or substantially distinct impedance characteristics. Of course, the particular configuration used will depend upon the application.

For instance, multiple plasma applicators can be used to employ distinct excitation frequencies for selected zones in a variety of applications. These applications include film deposition using plasma enhanced chemical deposition, etching by way of ion enhanced etching or chemical dry etching and others. Plasma cleaning also can be performed by way of the multiple plasma applicators. Specifically, at least one of the plasma applicators will define a cleaning plasma used for cleaning purposes. In one embodiment, this cleaning plasma can have an oxygen containing species. This cleaning plasma is defined by using an oxygen discharge, which is sustained by microwave power to a cavity or resonant microwave chamber abutting or surrounding a conventional dielectric vessel. Of course, a variety of other processes also can be performed by way of this multiple plasma applicator embodiment.

This present application using multiple plasma applicators can provide a multi-zone (or multi-chamber) plasma source without the use of conventional mechanical separation means (e.g., baffles, separate process chambers, etc.). Alternatively, the degree of interaction between adjacent zones or chambers can be relaxed owing to the use of voltage potential control via wave adjustment circuits. This plasma source provides for multiple plasma source chambers, each with its own control via its own plasma applicator. Accordingly, each plasma applicator provides a physical zone region (i.e., plasma source) with selected plasma characteristics (e.g., capacitively coupled current, inductively coupled current, etc.). These zones can be used alone or can be combined with other zones. Of course, the particular configuration will depend upon the application.

In the present embodiments, the wave adjustment circuit can be made from any suitable combination of element(s) such as various types of transmission lines, circuits, etc. These transmission lines include conventional solid or air dielectric coaxial cable, or ordinary, repeating inductor/capacitor discrete approximations to transmission lines, and others. These types of transmission lines are co-axial transmission lines, balanced parallel transmission lines, so called slow wave transmission lines with a spiral inner conductor (e.g., selected portions of a helical resonator, etc.), and others. Individual lumped, fixed, or adjustable combinations of resistors, capacitors, and inductors (e.g., matching networks, etc.) also can be used in place of transmission line sections for the wave adjustment circuit. These general types of wave adjustment circuits are frequency dependent, and can be termed frequency dependent wave adjustment circuits (or FDWACs).

Frequency independent elements also can be used as the wave adjustment circuits. These wave adjustment circuits can be termed frequency independent WACs (or FIWACs). Frequency independent wave adjustment circuits include degenerate cases such as short-circuit connections to ground or an infinite impedance (i.e., open circuit), and others. Frequency independent wave adjustment circuits can be used alone, or in combination with the frequency dependent wave adjustment circuits. Alternatively, the frequency dependent wave adjustment circuits can be used alone or in combination with other wave adjustment circuits. Other variations, alternative constructions, and modifications also may be possible depending upon the application.

Figure 2E:
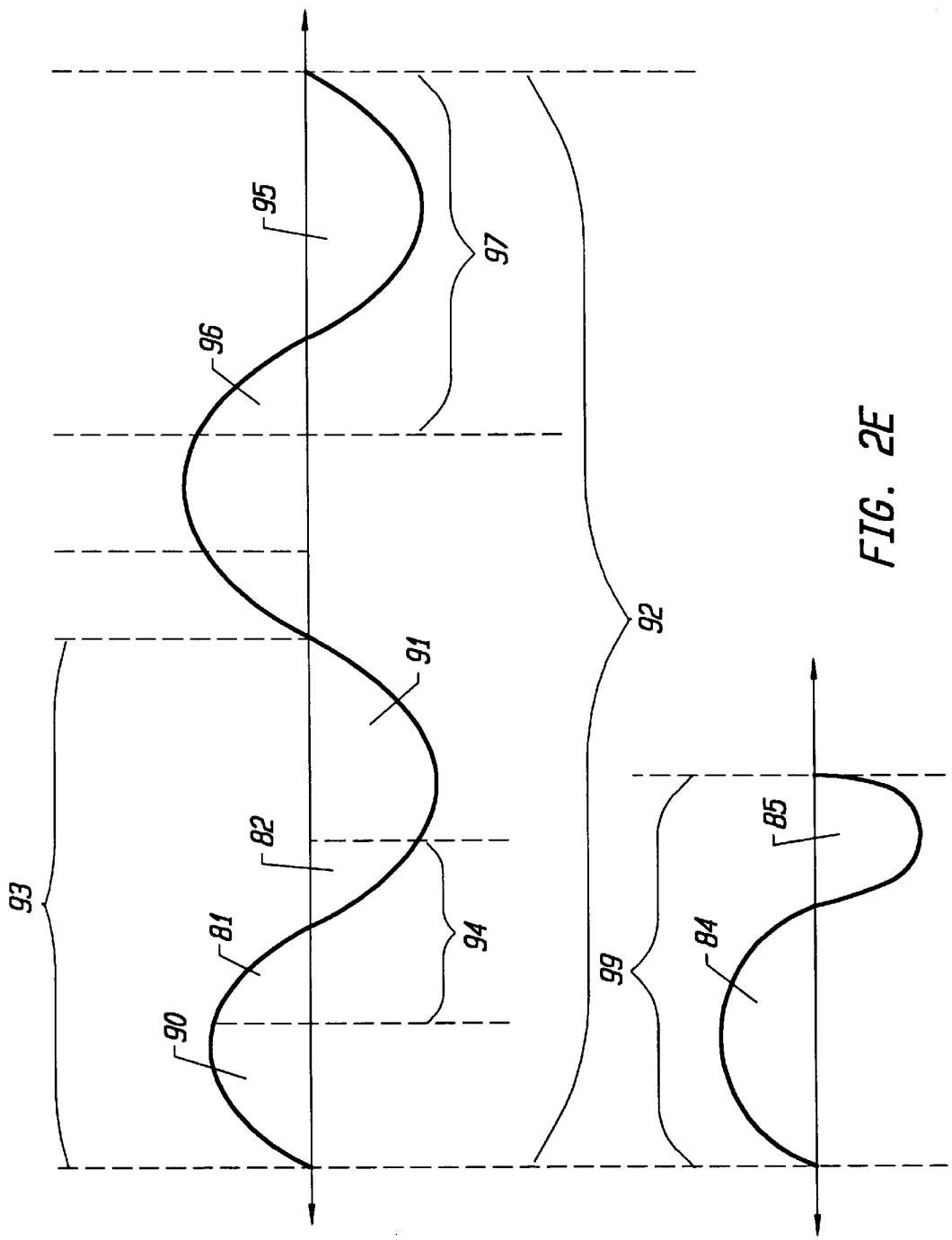

With regard to operation of the wave adjustment circuits, various embodiments can be used, as illustrated by FIG. 2E. The wave adjustment circuits are used to select a wave length portion to be applied in the plasma applicator. In some embodiments, the average rf plasma potential is maintained close to ground potential by providing substantially equal phase 90, 81 and anti-phase 91, 82 capacitively coupled portions of the inductive applicator. This can occur in multi-wave embodiments 92, full-wave embodiments 93, half-wave multiple embodiments, quarter-wave multiple embodiments, or any other embodiments 94.

In alternative embodiments, it is desirable to maintain an elevated source plasma voltage relative to ground potential to induce a controlled ion plasma flux (or ion bombardment) to the product substrate (or any other chamber bodies). These embodiments are provided by selecting distinct electrical lengths for each of the wave adjustment circuit sections such that the capacitive coupled current from a phase section of the inductive plasma applicator is in excess of capacitive coupled current from its anti-phase portion. In these embodiments, the wave adjustment circuit provides a deliberate imbalance between the phase and anti-phase of the coupled voltages. In some embodiments 97, this occurs by shifting the zero voltage nodes along the process chamber axially, thereby achieving a bias relative to the plasma discharge. As shown, the phase 95 is imbalanced relative to its anti-phase 96. In other embodiments 99, one phase portion 84 is imbalanced by way of a different period relative to its complementary phase portion 85. Other embodiments are provided where the source plasma voltage is lower relative to ground potential. In the embodiments were imbalance is desirable, the potential difference between the phase and anti-phase potential portions is reduced (or minimized) when the amount of sputtering (e.g., wall sputtering, etc.) is reduced. The amount of sputtering, however, can be increased (or maximized) by increasing the potential difference between the phase and anti-phase potential portions. Sputtering is desirable in, for example, sputtering a quartz target, cleaning applications, and others. Of course, the type of operation used will depend upon the application.

Current maxima on an inductive applicator with distributed capacitance (e.g., helical resonator transmission line, etc.) occur at voltage minima. In particular, conventional quarter-wave helical resonator current is substantially at a relative maximum at its grounded end of the coil, and to a lesser extend in the nearby coil elements. Therefore, partial inductive coupling of power, if it occurs, will tend to be at this grounded end. In conventional half-wave helical resonators, inductive coupling tends to occur at each of the two grounded ends.

In the present invention, substantially anti-symmetric phase and anti-phase inductive half-wave and other fractional wave applicator sections support substantially more inductive coupling at a selected rf voltage node, e.g., FIG. 2A reference numeral 00. This effect is caused by high current flow in the inductor applicator zones (or sections) both directly above and below the node (corresponding to inductor elements in the phase and anti-phase sections at and immediately adjacent to the rf voltage zero point). It should be noted that conventional quarter and half-wave inductively coupled inductive applicators have inductive coupling which abruptly declines below the grounded coil locations because the coil terminates and voltage extrema are present at these locations. This generally produces conventional quarter and half-wave helical resonators that tend to operate in a capacitive mode, or with a substantial fraction of power which is capacitively coupled to the plasma, unless the plasma is shielded from coil voltages, as noted above.

In a specific embodiment, the power system includes selected circuit elements for effective operation. The power system includes an rf power source. This rf power source can be any suitable rf generator capable of providing a selected or continuously variable frequency in a range from about 800 kHz to about 80 MHz. Many generators are useful. Preferably, generators capable of operating into short and open-circuit loads without damage are used for industrial applications. One example of a suitable generator is a fixed frequency rf generator 28.12 MHz–3 kW CX-3000 power supply made by Comdel, Inc. of Beverly, Mass. A suitable variable frequency power supply arrangement capable of the 3 kW output over an 800 kHz to 50 MHz range can be made by driving an IFI Model TCCX3500 High Power Wide Band Amplifier with a Hewlett Packard HP116A, 0–50 MHz Pulse/Function Generator. Other generators including those capable of higher or lower power also can be used depending upon the application.

Power from the generator can be transmitted to the plasma source by conventional coaxial cable transmission line. An example of this transmission line is RG8/U and other higher temperature rated cable (e.g., RG1151U, etc.) with a coaxial TEFLON dielectric. In some embodiments, power is fed to conventional end-grounded half-wave helical resonators by positioning a movable tap on the helical coil and connecting a power source between the tap and the ground. In other embodiments, matching networks can be introduced between the coaxial cable power feed and the helical coil tap for flexibility. The matching network will depend on the selected wave configuration and wave adjustment circuits. In a balanced half-wave helical resonator embodiment, for example, the ends of the resonator coil can be terminated with wave adjustment circuits which substantially have zero susceptance. In particular, the wave adjustment circuit is designed as an open circuit by making no electrical connections to the ends of the coil, or establishing an electrical equivalence thereof. Alternatively, the ends of the coil are isolated by chokes series resistance, thereby DC coupled to a fixed reference potential. These types of wave adjustment circuits are frequency independent and are "degenerate" cases. In these embodiments, the rf power is provided such that the phase and anti-phase current flows above and below the electrical midpoint of the coil. This provides for substantially balanced phase and anti-phase current flow from the power source stabilizing desired operation in coil voltages above the midpoint of the coil, and also provides substantially equal phase and anti-phase voltages.

Figure 3:
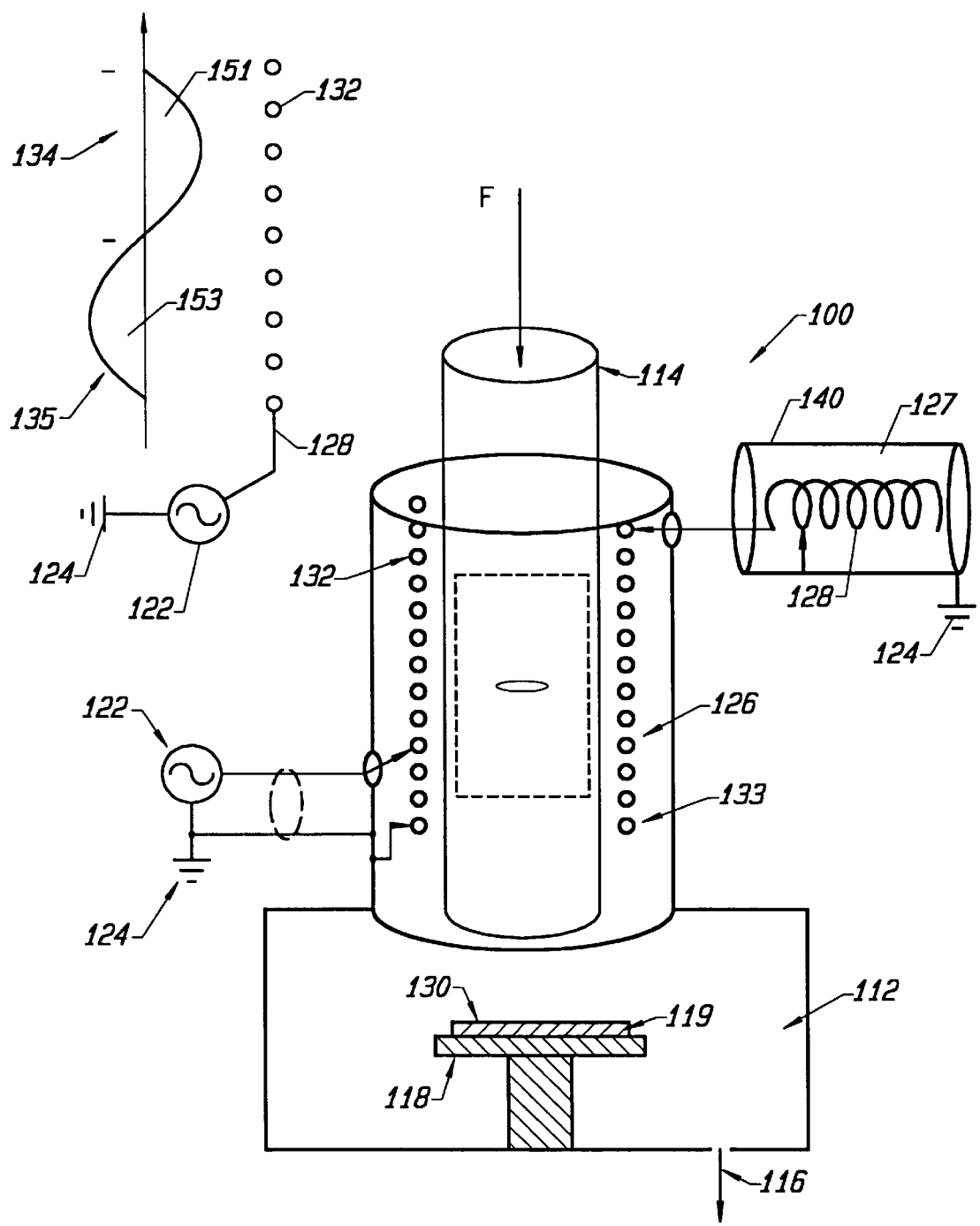
FIG. 3 is a simplified diagram of a chemical vapor deposition apparatus according to the present invention.

The embodiments described above also can be applied to other plasma processing applications, e.g., PECVD, plasma immersion ion implantation (PIII), stripping, sputtering, etc. For instance, FIG. 3 is a simplified CVD apparatus 100 according to the present invention. The present CVD apparatus includes a chamber 112, a feed source 114, an exhaust 116, a pedestal 118, a power source 122, a ground 124, a helical resonator 126, and other elements. The helical resonator 126 has a coil 132, an outer shield 133, and other elements. The chamber can be any suitable chamber capable of housing a product 119 such as a wafer for deposition, and for providing a plasma discharge therein. Preferably, the chamber is a right circular cylinder chamber for providing an uniform plasma species distribution over the product. But the chamber can also be configured in the form of rectangular right cylinder, a truncated cone, and the like. The chamber and fixtures are constructed from aluminum and quartz, and other suitable materials. The plasma discharge is derived from a plasma source which is preferably a helical resonator discharge or other inductive discharge using a wave adjustment circuit or other techniques to selectively adjust phase-anti-phase potentials. The present CVD apparatus provides for deposition of a dielectric material, e.g., silicon dioxide or the like.

The product 119 having an upper surface 130 is placed into the present CVD apparatus for deposition, e.g., plasma enhanced chemical vapor deposition (PECVD), and others. Examples of deposition materials include a dielectric material such as a silicon dioxide ($SiO_2$), a phosphosilicate glass (PSG), a borophosilicate glass (BPSG), a silicon nitride ($Si_3N_4$), among others.

In one embodiment, the deposition occurs by introducing a mixture comprising organic silane, oxygen, and an inert gas such as helium or argon according to the present invention. The organic silane can be any suitable organic silicate material such TEOS, HMDS, OMCTS, and the like. Deposition is also conformal in selected instances. As for the oxygen, it includes a flow rate of about 1 liter/per minute and less. A relative flow rate between the organic silane such as TEOS and oxygen ranges from about 1:40 to about 2:1, and is preferably less than about 1:2 in certain applications. A deposition temperature of the organic silane-oxygen layer ranges from about 300 to about 500° C., and can also be at other temperatures. Pressures in the range of 1 to 7 Torr are generally used. Of course, other concentrations, temperatures, materials, and flow rates can be used depending upon the particular application.

This chamber also includes a wave adjustment circuit 127. The wave adjustment circuit 127 is used to provide a helical coil operating with capacitive coupling to selected phase and anti-phase voltages. This portion 127 of the wave adjustment circuit coil also is shielded 140 to prevent rf from interfering with the plasma discharge or external elements, e.g., equipment, power, etc. The coil shield 140 is made of a conductive material such as copper, aluminum, or the like. In one embodiment, an operating frequency is selected and the wave adjustment circuit is dadjusted to short circuit the upper end of the helical applicator coil to ground 124. This provides a helical coil operating at approximately a full-wave multiple and has substantially equal phase and anti-phase sections. This full-wave multiple operation provides for balanced capacitance of phase 151 and anti-phase 153 voltages along the coil 132 adjacent to the plasma source. Full-wave multiple operation reduces or even substantially eliminates the amount of capacitively coupled power from the plasma source to chamber bodies (e.g., pedestal, walls, wafer, etc.) at or close to ground potential.

In the present embodiment, the wave adjustment circuit 127 is a variable coil portion 128 of a spiral transmission line, which is selectively placed outside the outer shield 133. Accordingly, when the wave adjustment circuit is adjusted to become a short circuit, the plasma source "sees" only a selected full-wave multiple comprising substantially equal phase 151 and anti-phase 153 of the entire instantaneous AC voltages 134, 135. In this embodiment, stress of the deposited oxide film is often tensile, which can be undesirable.

Alternatively, the wave adjustment circuit 127 provides a helical resonator operating at selected phase and anti-phase voltages that are not full-wave multiples. This wave adjustment circuit provides for a selected amount of capacitive coupling from the plasma source to the chamber bodies. Stress of the deposited oxide film in this embodiment can be made to be zero or slightly compressive. In some embodiments, the oxide films can be deposed with an rf plasma potential of several hundred volts between the plasma source and the substrate to decrease the tendency of the oxide film to absorb moisture. This can occur by adjusting the wave adjustment circuit to add in a small section of transmission line outside of the source and correspondingly shortening the applicator coil (by moving the lower point at which the applicator coil is short-circuited and thereby decreasing the inductance of the applicator coil and electrical length of the helical resonator 126 (e.g., spiral transmission line, etc.) ). Of course, the selected amount of capacitive coupling will depend upon the application.

Figure 4:
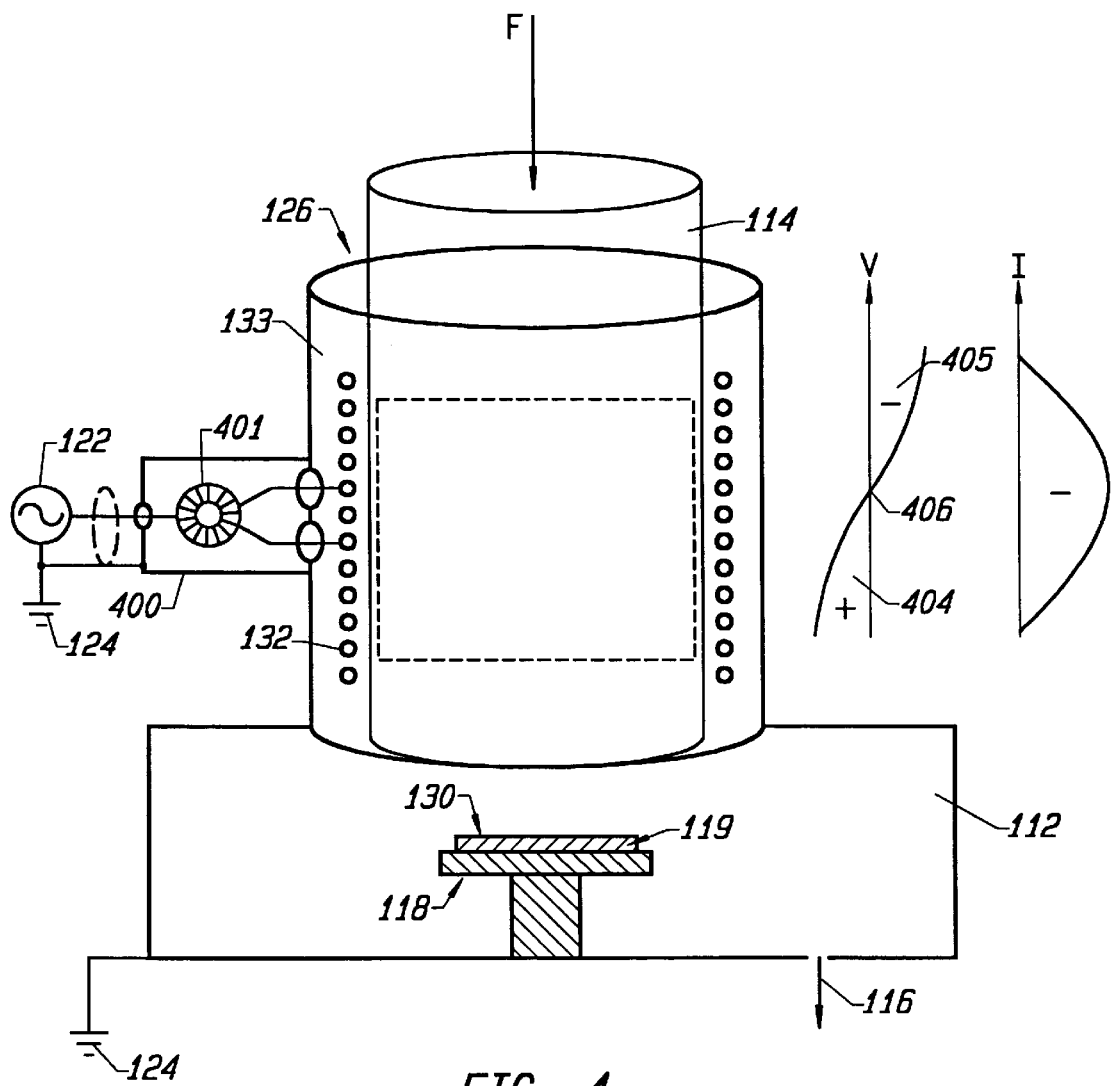
FIG. 4 is a simplified diagram of a stripper according to the present invention.

FIG. 4 is a simplified diagram of a resist stripper according to the present invention. The present stripping apparatus includes similar elements as the previous described CVD apparatus. The present stripping apparatus includes a chamber 112, a feed source 114, an exhaust 116, a pedestal 118, an rf power source 122, a ground 124, a helical resonator 126, and other elements. The helical resonator 126 includes a coil 132, an outer shield 133, a wave adjustment circuit 400, and other elements. The chamber can be any suitable chamber capable of housing a product 119 such as a photoresist coated wafer for stripping, and for providing a plasma discharge therein. The plasma discharge is derived from a plasma source, which is preferably a helical resonator discharge or other inductive discharge using a wave adjustment circuit or other techniques to selectively adjust phaseanti-phase potentials. The present stripping apparatus provides for stripping or ashing photoresist, e.g., implant hardened, etc. Further examples of such a stripping apparatus are described in the experiments section below.

In this embodiment, the wave adjustment circuits rely upon open circuits (i.e., zero susceptance). Power transfer can be occurred with a balanced feed such as an inductively-coupled push-pull arrangement such as coupled inductors. Techniques for constructing these coupled inductors are described in, for example, "The ARRL Antenna Book," R. D. Straw, Editor, The American Radio Delay League, Newington, Conn. (1994) and "The Radio Handbook," W. I. Orr, Editor, Engineering Ltd, Indiana (1962), which are both hereby incorporated by reference for all purposes. In one embodiment, a ferrite or powdered iron core "balun" (balanced-unbalanced) toroidal transformer (i.e., broadband transmission transformer, broadband transformer, etc.) 401 can be used to provide balanced matching from a conventional unbalanced coaxial transmission line. Techniques for constructing toroidal baluns are described in, for example, "Transmission Line Transformers," J. Sevick, 2nd Edition, American Radio Relay League, Newington, Conn. (1990). The toroidal transformer is coupled between the rf power source 122 and the coil 132. The midpoint 406 between the phase 405 and anti-phase voltage on the coil is effectively rf grounded, hence it may be convenient to directly ground this midpoint of the inductive application in some embodiments for stability. This permits alternate operation in which power may be coupled into the inductive applicator (e.g., coil, etc.) with a conventional unbalanced feed line tapped on one side of the center. Push-pull balanced coupling ignites the plasma more easily than conventional unbalanced coil tap matching and generally is easier to adjust in selected applications.

Figure 5A:
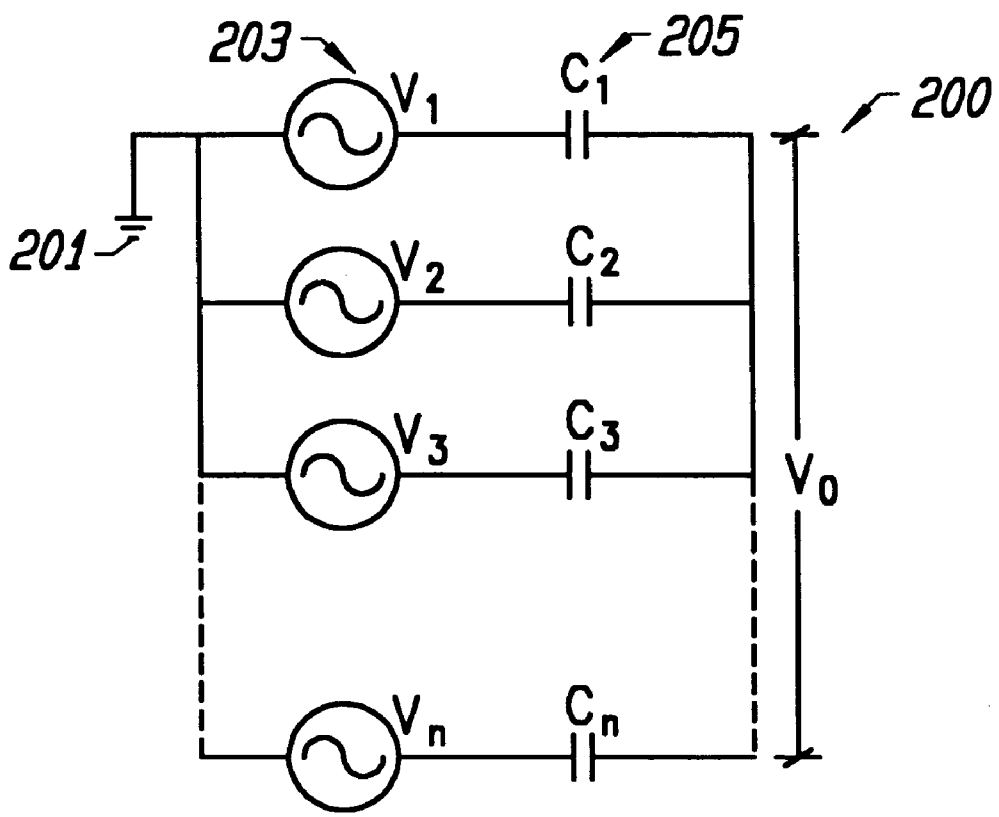
FIGS. 5A–5C are more detailed simplified diagrams of a helical resonator according to the present invention.

Referring to the helical resonator embodiments operating at substantially equal phase and anti-phase potentials, FIG. 5A is a simplified diagram 200 of an equivalent circuit diagram of some of them. The diagram is merely an illustration and should not limit the scope of the claims herein. The equivalent circuit diagram includes a plurality of rf power supplies ($V_1$, $V_2$, $V_3$ ... $V_n$) 203, representing for example, a single rf power source. These power supplies are connected in parallel to each other. One end of the power supply is operably coupled to a ground connection 201. The other end of the power supplies can be represented as being connected to a respective capacitor ($C_1$, $C_2$, $C_3$ ... $C_n$). Each of these capacitors are connected in parallel to each other. During this mode of operation, substantially no voltage difference exists between any of these capacitors, as they are all connected to each other in parallel.

Figure 5B:
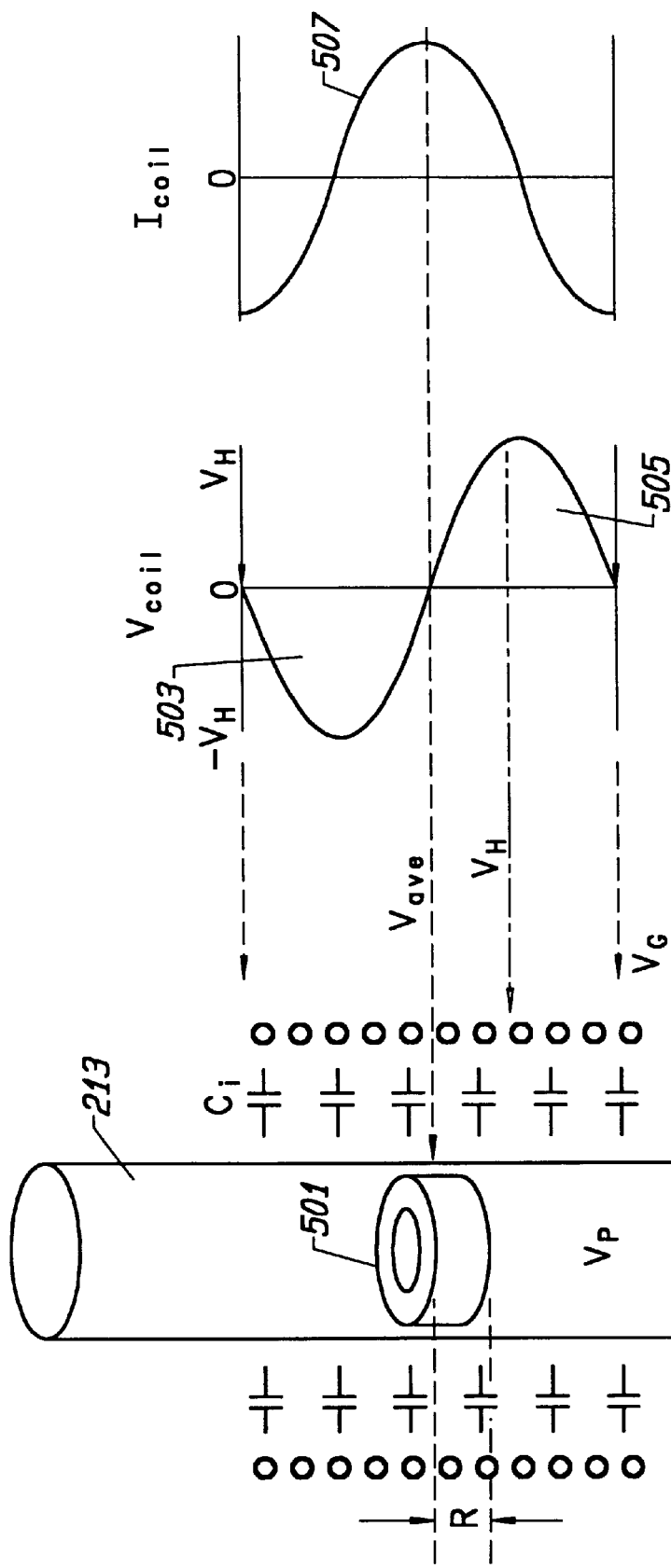

FIG. 5B is a simplified diagram of instantaneous AC voltage and current along a helical resonator coil of FIG. 5A where each end of the inductive applicator is short circuited. The diagram is merely an illustration and should not limit the scope of the claims herein. This diagram includes the discharge tube 213 and an inductive plasma discharge (or plasma source) 501 therein. As shown, the plasma discharge includes an intensified "donut-shaped" glow region 501 that occupies a limited range (R) of the discharge tube 213. The plasma discharge has an average voltage potential ($V_{ave}$) of substantially zero volt between the ground potential ($V_G$) and the high voltage potential ($V_H$). As can be seen, the plasma discharge 501 has capacitively coupling elements to $V_H$ and $V_G$. But the average voltage potential of this plasma discharge is zero. This operation provides for balanced capacitance of phase 503 and anti-phase 505 voltages along the coil adjacent to the plasma, thereby substantially preventing capacitively coupling from the plasma source to chamber bodies. As also shown, a current maxima 507 exists at $V_{ave}$, which corresponds to an inflection point between the phase 503 and the anti-phase 505.

Figure 5C:
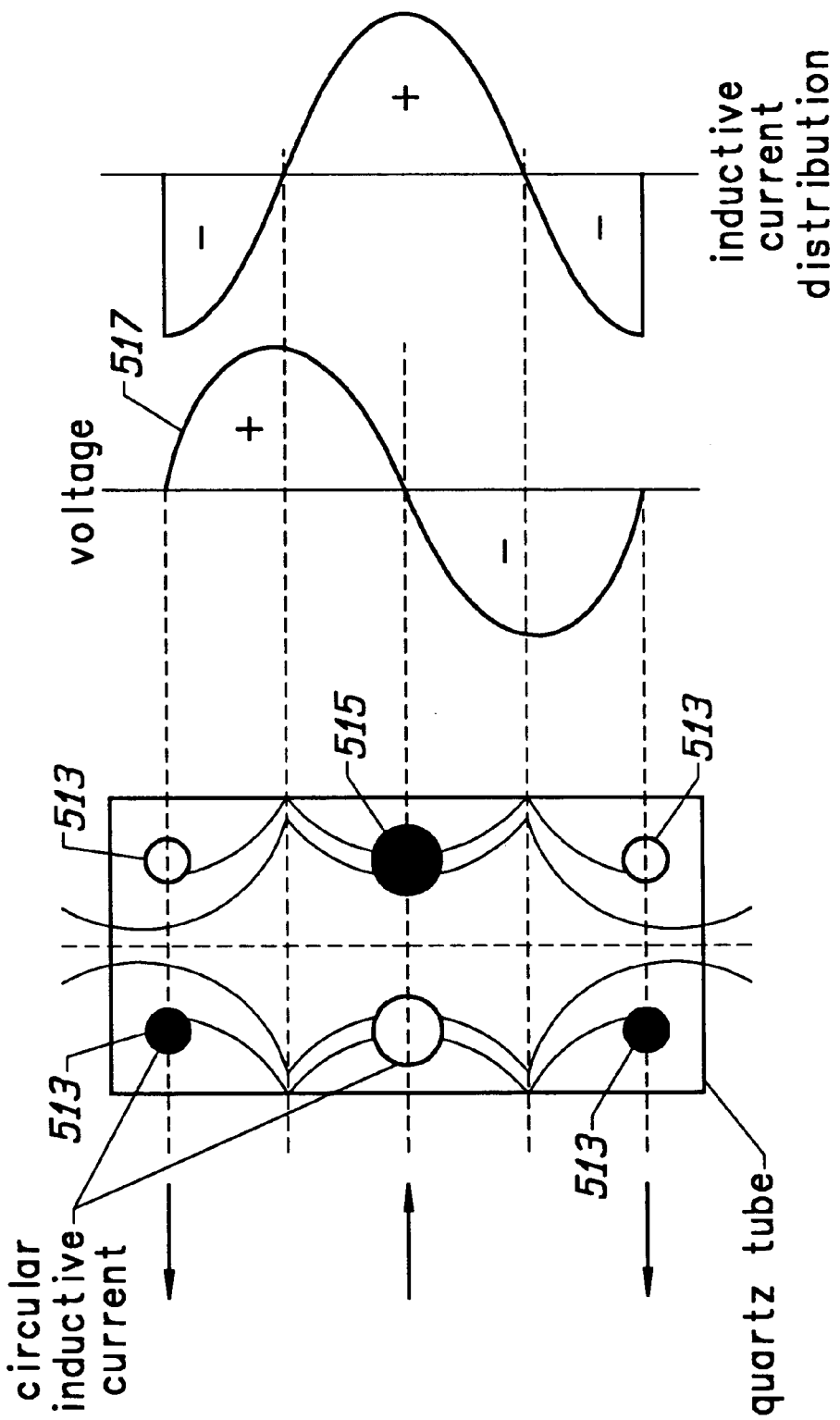

In an alternative operating mode, dim rings of plasma caused by inductively coupled plasma current are visible near top and bottom extremes of the inductive application, as illustrated by FIG. 5C. This operating mode is generally for a full-wave 517 inductive coupling coil operated at a very high power, e.g., maximum power input to the inductive applicator is often limited by thermal considerations and breakdown. The rings 513, 515 of current in the plasma discharge are simulated by maximum coil current areas corresponding to voltage minima at the top and bottom shorted ends of the coil. Under these high power conditions, subordinate current rings are detectable and some excitation is often visible in the intermediate regions. This excitation is partially caused by capacitively driven currents within the discharge coupled to the voltage maximum and voltage minimum positions along the inductive applicator.

Alternatively, subordinate inductive plasma current rings at the top and bottom ends 513 of the resonator do not appear with limited input power. The coil current and inductive flux fall beyond the ends of the inductive applicator so that a single inductive ring 515 in the center portion is more stable, provided that the conductivity of the plasma is large enough to support a single current ring at a specified input power.

In alternative applications using high power operation, no secondary plasma current rings may be desirable. These applications often have substantially minimum internal capacitive coupling. In these applications, the inductive applicator (e.g., coil) abutting the vacuum vessel may be shortened from a full wave to an appropriate length such that only the central current maxima exists on the coil abutting the plasma source and the potential difference between maximum and minimum voltage on the applicator is substantially reduced. The present application is achieved by stabilizing the desired waveform along the applicator by appropriate impedance wave adjustment circuits.

Referring to the above embodiments, the present invention provides for processing with an inductively coupled plasma in which the plasma potential from coupling to a phase portion of the inductive applicator is substantially not offset by capacitive coupling to anti-phase voltages on selective portions to the inductive coupling element. Conventional inductive sources (e.g., conventional helical resonators, etc.), however, have hitherto been operated in quarter-wave or half-wave modes. These modes provide only phase capacitive coupling to the plasma, which raises the plasma potential toward the coil without compensation anti-phase coupling. Conventional inductive sources that are longer than a half-wave have been generally considered cumbersome and impractical for plasma reactors. In particular, these inductive sources are large in size, and have nodes along the helical coil, which have been believed to create a non-uniform plasma. In order to operate a substantially inductive plasma in a helical resonator, conventional inductive sources relied upon shielding the plasma tube from electrical fields originating on the coil. Shielding occurred, for example, by inserting a longitudinally split shield between the coil and plasma tube.

The present invention provides for a substantially pure inductively coupled power source. A benefit of this inductively coupled power as a primary means to sustain plasma excitation is that electric field lines produced by inductive coupling are solenoidal (e.g. they close on themselves). Since solenoidal electric field lines have zero divergence, they do not create or support a scalar potential field (e.g. a voltage difference) within the plasma volume. Thus, in an ideal case, inductively coupled power can be transferred into a plasma without no direct relationship between the plasma potential and the voltages on coupling elements (e.g. the voltage on the coil in a helical resonator) or voltages on rf matching networks, if such are used. Furthermore, when transferring power to the plasma by purely inductive means, power transfer does not require any significant potential difference to be maintained between elements of the plasma and ground potential (e.g. the potential difference between the plasma and ground can be fixed by factors which are substantially independent of inductive excitation power). Although in theory, inductive power transfer does not require raising the AC or DC potential of the plasma with respect to ground, in practice there has been substantial shift and harmful alteration in the plasma potential found in unshielded current art inductive sources.

As previously noted, and further emphasized herein, the most effective conventional method employed to avoid plasma potential shift in conventional commercially available inductive sources is to shield the plasma from the electrical fields on the inductive coupling element (commonly a multi-turn coil) by inserting a grounded conductive member between the inductive driving element and the plasma discharge tube. Shielding is, however, cumbersome and inconvenient and has serious disadvantages in practice. Shields couple to inductive applicator elements and can cause wide excursions in the natural resonance frequency, which are not predicted by conventional design formulae. This often results in laborious trail and error and iterative mechanical designs to achieve a desired resonance. Another disadvantage of shielding is that shields often make it difficult to achieve initial ignition of the plasma since shields generally exclude capacitive electric fields in the plasma discharge tube. In particular, ignition (known as plasma breakdown) of inductive breakdown generally begins with a capacitive electric field discharge, which is stable at lower currents and powers (S, for example, J. Amorim, H. S. Maciel and J. P. Sudana, J. Vac. Sci. Technol. B9, pp. 362–365, 1991). Accordingly, shields tend to block capacitive electric fields, which induce plasma ignition.

Insertion of the shield close to high voltage RF point in a network (such as the voltage maximum points in a helical resonator or the high potential driven side of a TCP coil) also causes large displacement currents to flow through the capacitance between the shield and coil. This high potential difference is also a potential cause of damaging rf breakdown across the air gap, hence the gap may require protection by inconvenient solid or liquid dielectric insulation. The displacement current flow causes power loss and requires that higher power RF generating equipment be used to compensate for the power loss. Coupling loss in the plasma source structure is also undesirable from the standpoint of thermal control. These limitations are overcome by the present invention using the wave adjustment circuits, an inductive applicator of selected phase length, and other elements.

Experiments

To prove the principle and demonstrate the operation of the present invention, a helical resonator plasma source was used in a photoresist stripper. Conventional helical resonators also were evaluated in these experiments. These experiments are merely examples, and should not limit the scope of the claims herein. One of ordinary skill in the art would easily recognize other experiments, uses, variations, and modifications of the inventions defined by these claims.

I. Conventional Photoresist Stripper

In this experiment, the conventional resist stripper was a prototype made by MC Electronics, present assignee. Of course, other stripper platforms also can be used depending upon the application. A conventional quarter-wave helical resonator resist stripper 600 was constructed with a quarter-wave helical resonator source 602 upstream of a processing chamber 604, shown in FIG. 6. This quarter-wave helical resonator 602 included a coil 608 and other elements.

Coil 608 consisted of 5.15 turns of 0.4 inch diameter copper tubing would with a pitch of 0.5 turns per inch with a mean radius of 6.4 inches and centered radially and vertically inside an outer copper shield 610. Coil 608 is operably coupled to a power source 612 and operated at about 13 MHz radio frequency. A 17 inch long, 9.25 inch diameter quartz tube 606 was centered inside of the copper coil 608. The shield 610 was 16 inches inside diameter, approximately 0.08 inches thick and 18 inches long. This shield 610 also was connected to a ground ($V_G$) connection on the aluminum process chamber body (except when making the current measurements described below).

The process chamber 604 was for a conventional resist stripper. This resist stripper included a wafer support 616 (or pedestal) and other elements. Process chamber 604 is operably coupled at an outer location 620 to ground via shield 610. Wafer support 616 has a wafer 618 disposed thereon.

The wafer 618 is a 6-inch (250 mm) <100> type wafer with approximately 1.25 microns of spin-coated Mitsubishi Kasei positive photoresist MPR-4000. This wafer was ashed on the grounded 10 inch diameter wafer support 616. This support was resistivity heated and the temperature of the substrate support was sensed with a thermocouple.

After the helical resonator plasma was ignited, visible plasma filled the quartz plasma tube under all of the conditions used for processing. In addition, a strong plasma glow was always visible above the wafer in the downstream processing chamber which was indicative of secondary plasma discharge to the substrate support. This secondary plasma discharge was also accompanied by current flow from the resonator shield to the chamber of approximately 5–10 Amperes rms (and sometimes even more) which could be measured by elevating the shield on insulating blocks and monitoring the current flow through a 2 inch long 1.5 inch wide strip of copper braid which was passed through a Pearson Current probe used to monitor the current.

Figure 6:
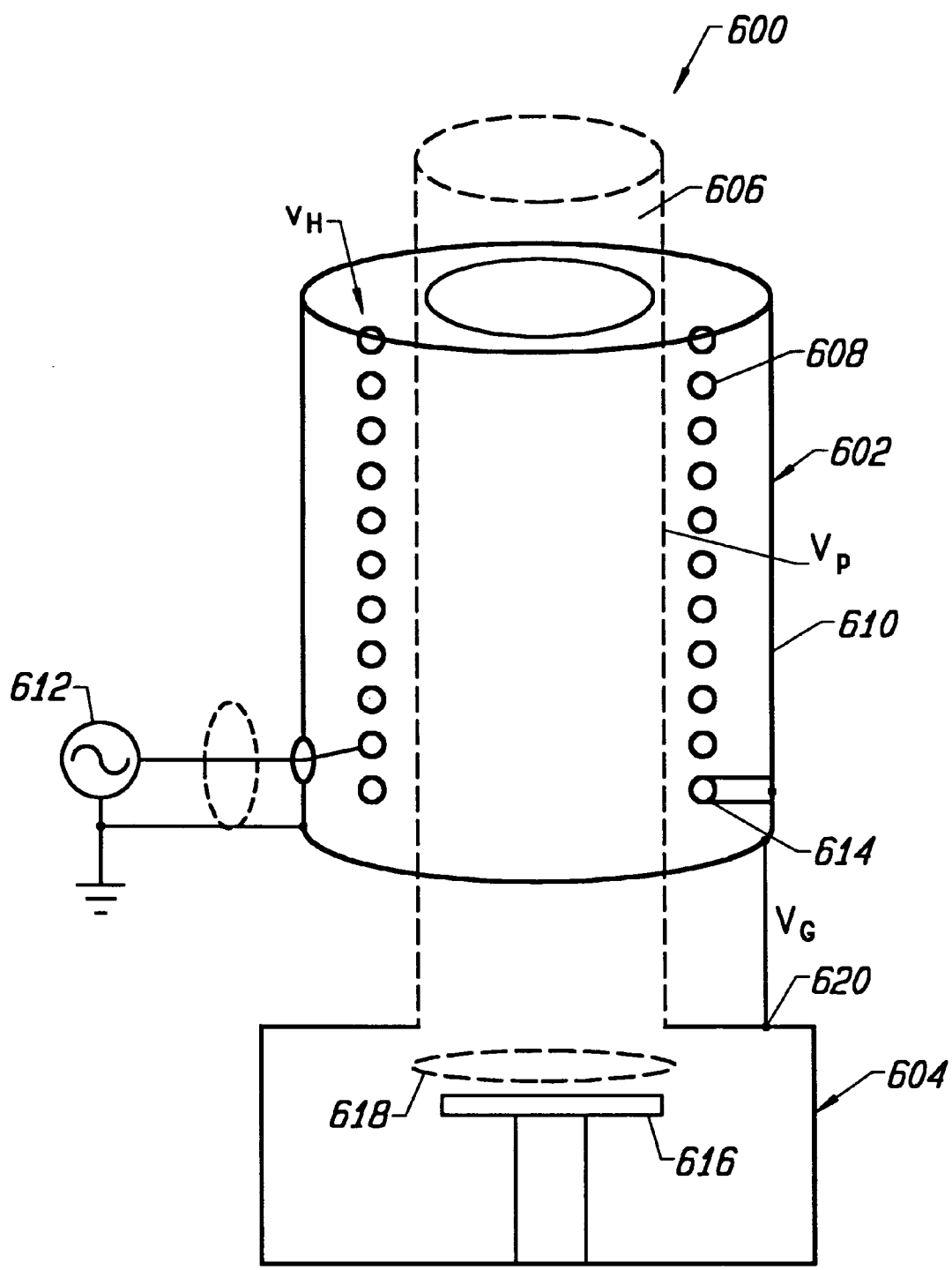
FIG. 6 is a conventional quarter-wave helical resonator plasma etching apparatus with stray plasma which results from the coupling in the conventional design.
Figure 7:
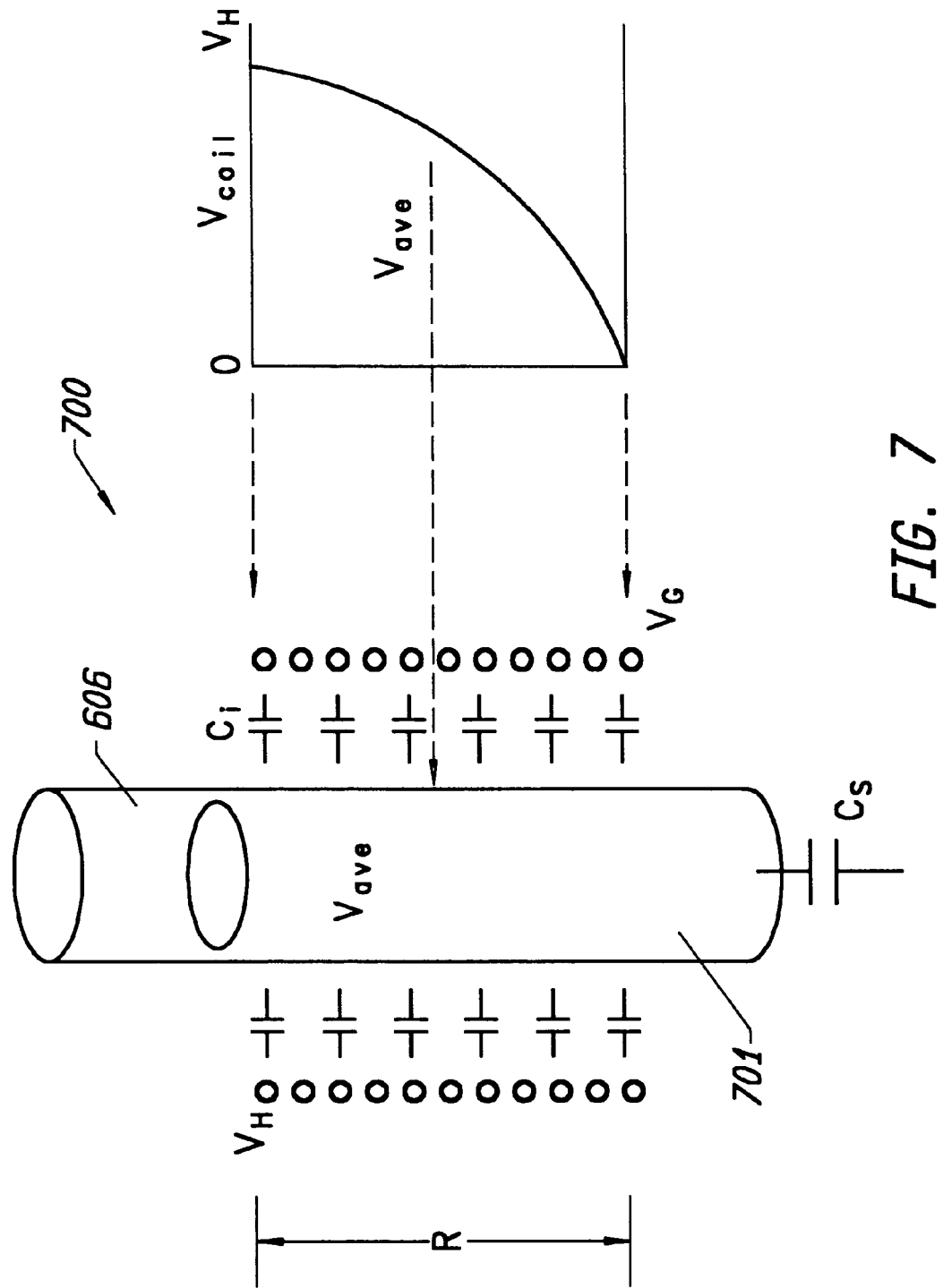
FIG. 7 is a simplified diagram of the rf voltage distribution along the coil of the FIG. 6 apparatus.

FIG. 7 is a simplified diagram 700 of the rf voltage distribution along the coil for the quarter-wave helical resonator of FIG. 6. This diagram includes the quartz tube 606 and a plasma discharge (or source) 701 therein. As shown, the plasma discharge includes a glow region that 701 occupies a large range (R) of the quartz tube 606. The plasma discharge has an average voltage potential ($V_{ave}$) between the ground potential ($V_G$) and the high voltage potential ($V_H$). As can be seen, the plasma discharge 701 has capacitively coupling elements to $V_H$ and $V_G$ due to its average voltage potential $V_{ave}$. In fact, as previously noted, the current flow from the resonator shield to the chamber was at least 5–10 Amperes rms. In high power applications, intense sparking was observed in the chamber from the capacitively coupled plasma source.

II. Present Photoresist Stripper

To prove the principle and operation of the present inventions, experiments were performed. These experiments used a photoresist stripper apparatus. This resist stripper apparatus in a cluster tool arrangement used a helical resonator according to the present inventions. One of ordinary skill in the art, however, would recognize that other implementations, modifications, and variations may be used. Accordingly, the experiments performed herein are not intended to limit the scope of the claims below.

Figure 8:
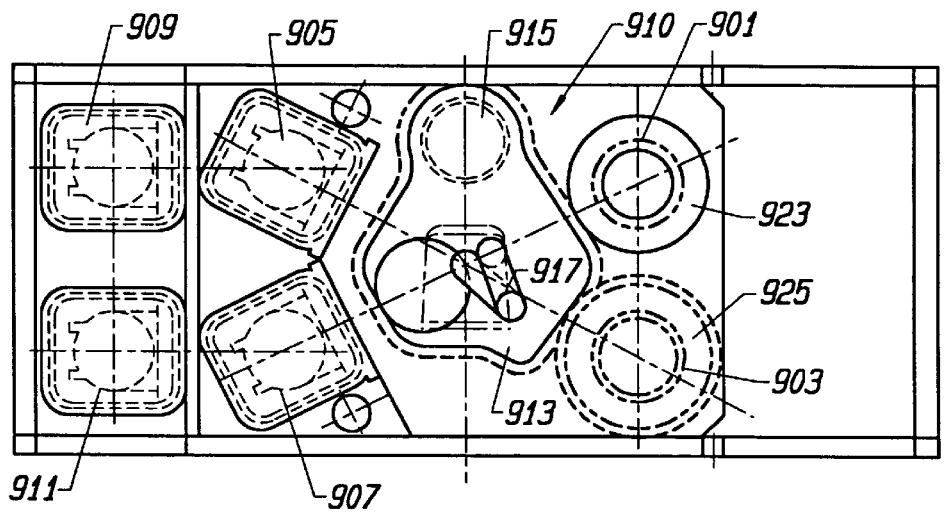
FIG. 8 is a simplified top-view diagram of a stripping apparatus according to the present experiments.
Figure 9:
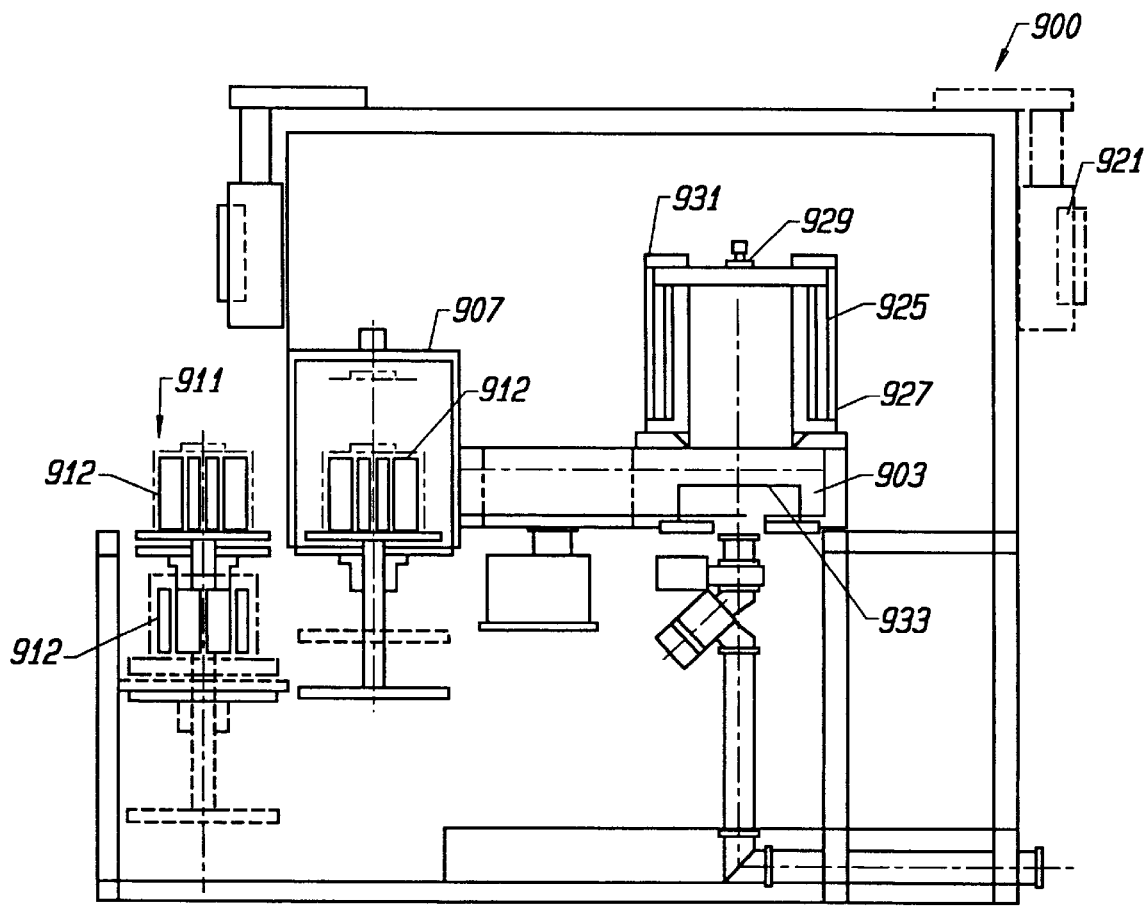
FIG. 9 is a simplified side-view diagram of a stripping apparatus according to the present experiments.

The photoresist stripper apparatus was configured with multiple process chambers in a cluster tool arrangement, as illustrated by FIGS. 8 and 9. FIGS. 8 and 9 illustrate a simplified top-view diagram 800 and a simplified side-view diagram, respectively. Two process chambers, e.g., chamber 1 901 and chamber 2 903, were used. Chamber 1 901 was used for stripping implant hardened resist crust (or skin). Chamber 2 903 was used for stripping the remaining photoresist. Alternatively, the chambers can be both used for stripping implant hardened resist crust and stripping remaining photoresist. Of course, the particular use depends upon the application. These chambers also were made of aluminum with ceramic inserts, which is highly resistant to chemical attack.

The apparatus also used a microprocessor based controller to oversee process operations. This microprocessor based controller can be accessed through a control panel 921. The present apparatus used a controller made from a 486DX processor PC made by EPSON, with a color LCD touch panel display. This controller also is shielded and highly resistant to chemical attack.

An automatic wafer handling system 910 was also provided. The automatic wafer handling system used standard cassettes 912 for transferring the photoresist coated wafers to and from the process chambers 901, 903. The automatic wafer handling system included a robot 917, cassette chamber 1 905, cassette chamber 2 907, cassette stage 1 909, cassette stage 2 911, and other elements. The wafer handling system 910 used a conventional interlock system for providing the cassettes 912 from the cleanroom into the process chambers 901, 903. A main shuttle chamber 913 housed the robot 917 in the cluster tool arrangement. The controller oversees the automatic wafer handling system operations. The present wafer handing system is made by JEL Co., LTD of Japan.

A cooling plate 915 was included in the main chamber 913 housing the robot 917. The cooling plate 915 was of conventional design, and was capable of cooling the wafer after being stripped, which often occurs at elevated temperatures. Alternatively, the cooling plate can be used to thermally adjust the wafer temperature either before, after, or even between selected process operations.

The process chambers 901, 903 were disposed downstream from respective plasma sources 923, 925. Each helical resonator included a coil 927 disposed around a quartz tube 929. The coil consisted of 11.5 turns of 0.4 inch copper tubing wound with a pitch of 0.9 turns per inch with a mean radius of 9.4 inches and centered radially and vertically inside an outer copper shield 931. The coil is operably coupled to a power source (not shown). A 17 inch long, 9.25 inch diameter quartz tube was centered inside of the copper coil. The shield was 16 inches inside diameter, approximately 0.08 inches thick and 18 inches long. The shield is operably coupled to a lower portion of the coil.

In one experiment, processes were used for stripping photoresist from wafers, e.g., See FIG. 9 reference numeral 933. The processes involved the use of a multi-step stripping operation to remove implanted photoresist from semiconductor wafers. Samples were prepared using eight-inch wafers. These wafers were spin coated with Mitsubishi Kasei positive photoresist MPR-4000. Spin coating occurred at 1,200 rpm and 120° C. for 90 seconds. The resulting photoresist was about 1.2 microns in thickness in the sample wafers. These sample wafers were implanted to form a implanted hardened resist layer near the top of the photoresist.

An implant resist stripping process was performed to remove the top implant hardened resist. This occurred by stripping using an "un-balanced" phase and anti-phase coupling relationship in a half-wave helical resonator. The half-wave helical resonator was configured in one of the process chambers. In this chamber, the pedestal had a temperature of about 40° C. to maintain a low wafer temperature. This low wafer temperature was maintained to reduce the possibility of "popping." Popping occurs when vapor in the underlying photoresist explodes through the implant hardened resist.

After the top hardened layer was removed. The wafer was transferred into a chamber operating at a full-wave multiple. This chamber operated at a frequency of about 27.12 MHz at a full-wave multiple. The pedestal of this chamber was at 150 to 200° C. The full wave structure provided for balanced phase and anti-phase coupled currents, thereby reducing the amount of capacitively coupled plasma, which can be detrimental to the underlying substrate. In this step, overashing was performed to substantially remove all photoresist material from the wafer. No damage occurred to the underlying substrate during this overashing step.

Once the photoresist has been stripped, the wafer is cooled. In particular, the wafer is removed from the full-wave multiple process chamber, and placed on the cooling station. This cooling station reduces the temperature of the wafer (which was heated). This wafer is then reloaded back into its wafer cassette. Once all wafers have been processed in the cassette, the cassette comprising the stripped wafers is removed from the cluster tool apparatus. Characteristics of this half-wave helical resonator were described in detail above. In the present experiments, the following tests also were performed.

Test 1: 6-inch wafers were ashed at a total pressure of 0.13 Torr using a gas flow of 0.2 standard liter per minute of pure oxygen, forward rf power of 2200 watts and a reflected power of 150 watts at an excitation frequency of 13.4 Mhz. The substrate was held at 60° C. and wafers were ashed and then the discharge was extinguished). The ashing rate across the wafer was determined to vary between approximately 3411 Å/min and 3139 Å/min with the rates approximately symmetric about the center of each wafer and the maximum ashing rate at the center. The average etching rate was 3228 Å/min and etching uniformity was approximately 4 percent.

Test 2: 6-inch wafers were ashed at a total pressure of 1 Torr using a gas flow of 1 standard liter per minute, forward rf power of 2200 watts and a reflected power of 160 watts at an excitation frequency of 13.0 MHz. The substrate was held at 60° C. and the ashing rate was determined to very between approximately 3144 Å/min and 3748 Å/min depending on position on a wafer. The etching uniformity was approximately 9 percent.

Test 3: Resist coated wafers were implanted with a selected dose of $5 \times 10^{15}$ atoms/cm$^2$ at 40 kev arsenic (As). The wafers were cleaved into samples approximately 3 centimeters square. Two samples were then ashed on the substrate support simultaneously, under the various conditions listed in Table 1.

TABLE 1

Experimental Results for Ashing

| Run | Time(s) (sec.) | Pressure (Torr.) | O$_2$ Flow (slm)* | Fwd Pwr (W) | Refl. Pwr (W) | rf freq. (MHz) | Temp (C.) |
|---|---|---|---|---|---|---|---|
| A | 180 | 0.23 | 0.5 | 2,000 | 180 | 13.2 | 68 |
| B | 132 | 0.06 | 0.2 | 2,150 | 180 | 13.3 | 90 |
| C | 180 | 0.13 | 0.2 | 2,200 | 150 | 13.3 | 60 |
| D | 300 | 0.13 | 0.2 | 2,200 | 150 | 13.3 | 40 |
| E(I) | 90 | 0.09 | 0.1 | 2,200 | 80 | 13.4 | 40 |
| F(II) | 150 | 0.09 | 0.1 | 2,200 | 80 | 13.4 | 40 |

*slm = standard liters per minute (or 1000 sccm)
(I) Unimplanted resist was used in this test and ashing was terminated before endpoint was reached to test unifomrity. The average ashing rate was 5259 Å/min and uniformity was 7.5%.
(II) Implanted resist was etched for 150 sec, but endpoint was visible at 100 seconds.

Under conditions used for Run D, it was determined that resist was cleared from the entire wafer after 3 minute and 15 seconds. Consequently, the ashing time in the table included approximately 100 sec. overetching. Under conditions where practical ashing rates were attained, a visible plasma discharge and sheath could be observed over the wafer.

Diagnostic measurements of current similar to those performed in the conventional stripping apparatus were performed. In these measurements, currents from the shield of the resonator to the processing chamber gave values of at about 0.1 to 0.5 Amperes rms and less. These measurements were limited by error using available instrumentation. Accordingly, these currents were at least an order of magnitude below those currents measured above in the conventional stripping apparatus.

A visual inspection of the stripped wafers shows extremely good results. That is, the wafers were stripped at a sufficient rate for production operation and no substantial damaged occurred to the wafers. This provides for effective wafer tum-around-time and substantially no damage caused by the plasma. In addition, current measured from the shield to the chamber by elevating the shield on insulating blocks was less than about 0.5 Amperes rms and, in some instances, at or below measured error using available instrumentation. This current was substantially less than those measured in the conventional stripping apparatus.

While the invention has been described with reference to specific embodiments, various alternatives, modifications, and equivalents may be used. In fact, the invention also can be applied to almost any type of plasma discharge apparatus. This discharge apparatus can include an apparatus for plasma immersion ion implantation or growing diamonds, TCPs, and others. This discharge apparatus can be used for the manufacture of flat panel displays, disks, integrated circuits, diamonds, semiconductor materials, bearings, raw materials, and the like. Therefore, the above description should not be taken as limiting the scope of the invention which is defined by the appended claims.

What is claimed is:

1. A process for fabricating a product using a plasma source, said process comprising the steps of subjecting a substrate to entities, at least one of said entities emanating from a gaseous discharge excited by a high frequency field from an inductive coupling structure in which a phase portion and an anti-phase portion of capacitive currents coupled from the inductive coupling structure are selectively balanced;

wherein said inductive coupling structure is adjusted using a wave adjustment circuit, said wave adjustment circuit adjusting the phase portion and the anti-phase portion of the capacitively coupled currents.

2. The process of claim 1 wherein the wave adjustment circuit selectively adjusts a frequency of an rf power supply.

3. The process of claim 1 wherein the high frequency field is adjusted using a variable frequency power supply.

4. The process of claim 1 wherein the wave adjustment circuit comprises a transmission line.

5. The process of claim 1 wherein said process is provided in a chamber.

6. The process of claim 5 wherein the chamber is provided for a process selected from etching, deposition, sputtering, or implantation.

7. The process of claim 1 wherein said inductive coupling structure provides a wave multiple selected from a one-sixteenth wave, a one-eighth-wave, a quarter-wave, a half-wave, a three-quarter wave, and a full-wave.

* * * * *